US011482453B2

(12) United States Patent
Lee et al.

(10) Patent No.: US 11,482,453 B2
(45) Date of Patent: Oct. 25, 2022

(54) METHOD OF MANUFACTURING A SEMICONDUCTOR DEVICE USING A THERMALLY DECOMPOSABLE LAYER, A SEMICONDUCTOR MANUFACTURING APPARATUS, AND THE SEMICONDUCTOR DEVICE

(71) Applicant: Samsung Electronics Co., Ltd., Suwon-si (KR)

(72) Inventors: Seung-Heon Lee, Seoul (KR); Munjun Kim, Suwon-si (KR); Jaekang Koh, Seongnam-si (KR); Tae-Jong Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 315 days.

(21) Appl. No.: 16/784,830

(22) Filed: Feb. 7, 2020

(65) Prior Publication Data
US 2020/0395244 A1 Dec. 17, 2020

(30) Foreign Application Priority Data

Jun. 14, 2019 (KR) .................... 10-2019-0070864

(51) Int. Cl.
*H01L 21/768* (2006.01)
*H01L 21/033* (2006.01)
*H01L 21/3213* (2006.01)

(52) U.S. Cl.
CPC .... *H01L 21/76895* (2013.01); *H01L 21/0337* (2013.01); *H01L 21/32139* (2013.01); *H01L 21/7685* (2013.01); *H01L 21/76865* (2013.01)

(58) Field of Classification Search
CPC ............. H01L 21/768; H01L 21/76838; H01L 21/76895; H01L 21/76841; H01L 21/7685; H01L 21/76897; H01L 21/76836; H01L 21/76801; H01L 21/76829; H01L 21/76834; H01L 21/7682; H01L 21/31; H01L 21/3205; H01L 21/321;
(Continued)

(56) References Cited

U.S. PATENT DOCUMENTS 5,461,003 A * 10/1995 Havemann ........ H01L 21/02126
438/666
5,750,415 A * 5/1998 Gnade ............... H01L 21/02304
438/618
(Continued)

FOREIGN PATENT DOCUMENTS

JP 2005-092014 A 4/2005
JP 4299642 B2 7/2009
(Continued)

*Primary Examiner* — John P. Dulka
(74) *Attorney, Agent, or Firm* — Harness, Dickey & Pierce, P.L.C.

(57) ABSTRACT

Provided are a method of manufacturing a semiconductor device using a thermally decomposable layer, a semiconductor manufacturing apparatus, and the semiconductor device. The method includes forming an etch target layer on a substrate, forming thermally decomposable patterns spaced apart from each other on the etch target layer, forming a first mask pattern covering at least sidewalls of the thermally decomposable patterns, and removing the thermally decomposable patterns by a heating method to expose a sidewall of the first mask pattern.

20 Claims, 33 Drawing Sheets

(58) Field of Classification Search
CPC ........... H01L 21/3213; H01L 21/32139; H01L 21/0267; H01L 21/033; H01L 21/0331; H01L 21/027; H01L 21/0334; H01L 21/0337
See application file for complete search history.

(56) References Cited

U.S. PATENT DOCUMENTS

| | | |
|---|---|---|
| 6,467,491 B1 | 10/2002 | Sugiura et al. |
| 6,784,011 B2 | 8/2004 | Okumura |
| 6,946,382 B2 | 9/2005 | Townsend, III et al. |
| 7,981,803 B2 | 7/2011 | Jung |
| 8,322,299 B2 | 12/2012 | Yu et al. |
| 8,835,304 B2 | 9/2014 | Lu et al. |
| 9,991,118 B2 | 6/2018 | Kwon et al. |
| 2004/0020601 A1 | 2/2004 | Zhao et al. |
| 2006/0260545 A1 | 11/2006 | Ramaswamy et al. |
| 2011/0198757 A1* | 8/2011 | Su ..................... H01L 21/76805 430/5 |
| 2017/0350004 A1 | 12/2017 | Kaufman-Osborn et al. |
| 2019/0035677 A1 | 1/2019 | Chandhok et al. |
| 2020/0013619 A1* | 1/2020 | Kikuchi ............ H01L 21/31144 |
| 2020/0020523 A1* | 1/2020 | Kikuchi ............. H01L 21/3081 |

FOREIGN PATENT DOCUMENTS

| | | |
|---|---|---|
| KR | 10-2001-0082111 A | 8/2001 |
| KR | 10-0613674 B1 | 8/2006 |
| KR | 101921648 B1 | 11/2018 |

\* cited by examiner

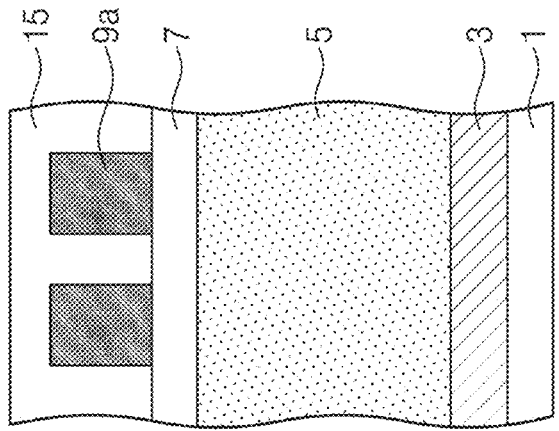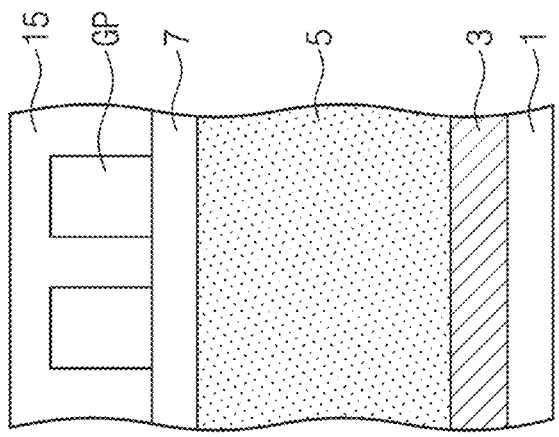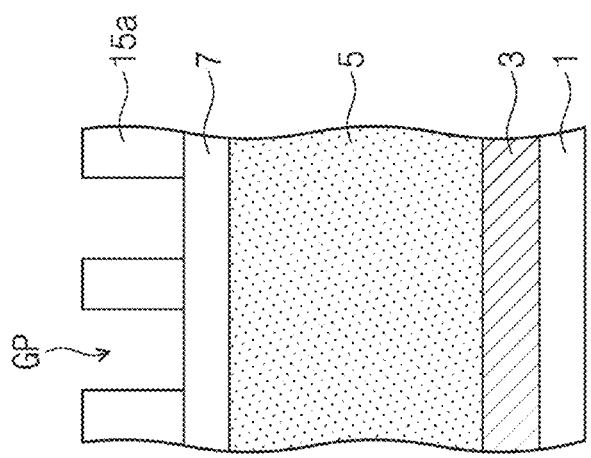

METHOD OF MANUFACTURING A SEMICONDUCTOR DEVICE USING A THERMALLY DECOMPOSABLE LAYER, A SEMICONDUCTOR MANUFACTURING APPARATUS, AND THE SEMICONDUCTOR DEVICE

CROSS-REFERENCE TO RELATED APPLICATION

This U.S. non-provisional patent application claims priority under 35 U.S.C. § 119 to Korean Patent Application No. 10-2019-0070864, filed on Jun. 14, 2019, in the Korean Intellectual Property Office, the disclosure of which is hereby incorporated by reference in its entirety.

BACKGROUND

Embodiments of the inventive concepts relate to a method of manufacturing a semiconductor device using a thermally decomposable layer, a semiconductor manufacturing apparatus, and/or the semiconductor device.

Semiconductor devices are widely used in the electronic industry because of their small sizes, multi-functional characteristics, and/or low manufacturing costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices have been highly integrated and structures of semiconductor devices have been more and more complicated.

SUMMARY

In an aspect, a method of manufacturing a semiconductor device may include forming an etch target layer on a substrate, forming thermally decomposable patterns spaced apart from each other on the etch target layer, forming a first mask pattern covering sidewalls of the thermally decomposable patterns, and removing the thermally decomposable patterns by a heating method to expose a sidewall of the first mask pattern.

In an aspect, a method of manufacturing a semiconductor device may include forming conductive patterns spaced apart from each other on a substrate, forming a thermally decomposable layer filling a space between the conductive patterns and covering the conductive patterns, forming a thermally decomposable pattern by removing an upper portion of the thermally decomposable layer, the thermally decomposable pattern partially filling the space between the conductive patterns and exposing upper sidewalls of the conductive patterns, conformally forming a first capping layer covering the conductive patterns and the thermally decomposable pattern, removing the thermally decomposable pattern to form a first gap region exposing lower sidewalls of the conductive patterns, and forming a second capping layer on the first capping layer.

In an aspect, a semiconductor manufacturing apparatus may include a transfer chamber, at least one thermally decomposable layer deposition chamber connected to the transfer chamber and configured to deposit a thermally decomposable layer formed of a polymer by supplying a first monomer and a second monomer, at least one annealing chamber connected to the transfer chamber and configured to decompose the thermally decomposable layer, and at least one capping layer deposition chamber connected to the transfer chamber and configured to deposit a capping layer.

In an aspect, a semiconductor device may include a first conductive pattern and a second conductive pattern adjacent to each other on a substrate, the first conductive pattern having a first upper sidewall adjacent to the second conductive pattern, and the second conductive pattern having a second upper sidewall adjacent to the first upper sidewall, a first capping layer being in contact with the first and second upper sidewalls and connecting the first and second upper sidewalls to provide a gap region between the first and second conductive patterns, the first capping layer defining a recess region thereon, and a second capping layer filling the recess region.

BRIEF DESCRIPTION OF THE DRAWINGS

The inventive concepts will become more apparent in view of the attached drawings and accompanying detailed description.

FIGS. 1A to 1I are cross-sectional views illustrating a method of manufacturing a semiconductor device, according to some embodiments of the inventive concepts.

DETAILED DESCRIPTION OF THE EMBODIMENTS

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as lower relative to other elements or features would then be oriented as upper relative to the other elements or features. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

When an element is referred to as being "on," "connected to," or "in contact with," another element, the element may be directly on, connected to, or in contact with the other element, or one or more other intervening elements may be present. In contrast, when an element is referred to as being "directly on," "directly connected to," "directly coupled to," or "immediately adjacent to," another element there are no intervening elements present.

Hereinafter, embodiments of the inventive concepts will be described in more detail with reference to the accompanying drawings.

Figure 2:
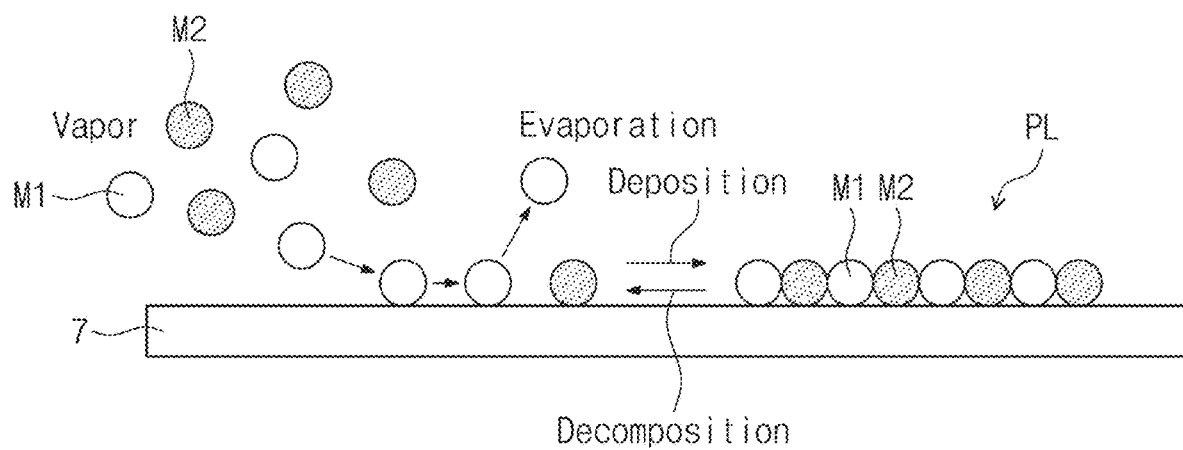
FIG. 2 is a view illustrating deposition and decomposition processes of a thermally decomposable layer according to some embodiments of the inventive concepts.
Figure 3:
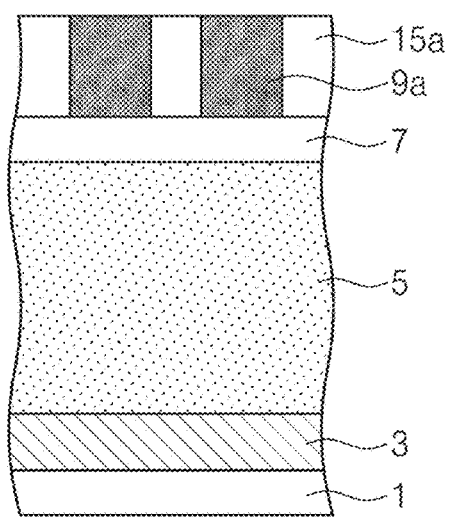
FIG. 3 is a cross-sectional view illustrating a method of manufacturing a semiconductor device, according to some embodiments of the inventive concepts.

FIGS. 1A to 1I are cross-sectional views illustrating a method of manufacturing a semiconductor device, according to some embodiments of the inventive concepts. FIG. 2 is a view illustrating deposition and decomposition processes of a thermally decomposable layer according to some embodiments of the inventive concepts. FIG. 3 is a cross-sectional view illustrating a method of manufacturing a semiconductor device according to some embodiments of the inventive concepts.

Figure 1A:
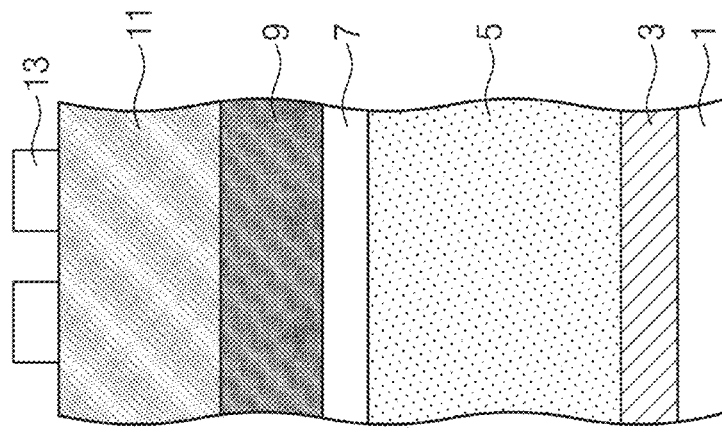

Referring to FIG. 1A, an etch target layer 3, a first mask layer 5, a second mask layer 7, a third mask layer 9, and a fourth mask layer 11 may be sequentially stacked on a substrate 1. A fifth mask pattern 13 may be formed on the fourth mask layer 11. Though not shown in the drawings, an interlayer insulating layer, interconnection structures and transistors may be between the substrate 1 and the etch target layer 3. The substrate 1 may be a semiconductor substrate or a silicon-on-insulator (SOI) substrate. Each of the etch target layer 3, the first to fourth mask layers 5, 7, 9, and 11 and the fifth mask pattern 13 may include a material having an etch selectivity with respect to at least other(s) thereof, which is or are adjacent thereto. For example, the etch target layer 3 may include a metal such as tungsten. The first mask layer 5 may include, for example, an amorphous carbon layer (ACL). The second mask layer 7 may include, for example, an amorphous silicon layer. The third mask layer 9 may include, for example, a thermally decomposable layer.

Referring to FIG. 2, in a process of forming the third mask layer 9, vapor of a first monomer M1 and vapor of a second monomer M2 may be supplied onto the second mask layer 7. The first monomer M1 may be the same as or different from the second monomer M2. The first monomer M1 and the second monomer M2 may be deposited on the second mask layer 7 and may react and cross-link with each other to form a polymer layer PL which is thermally decomposable. In the present specification, the polymer layer PL may be referred to as a thermally decomposable layer. The polymer layer PL may include carbon and hydrogen. The polymer layer PL may further include at least one of oxygen or nitrogen. The polymer layer PL may be, for example, polystyrene. In this case, the first monomer M1 and the second monomer M2 may be the same as each other and may be, for example, styrene. The polymer layer PL may be thermally decomposed at a first temperature. For example, the first temperature may range from 250° C. to 800° C. The process of depositing the third mask layer 9 (e.g., the polymer layer PL) may be performed at a second temperature lower than the first temperature. For example, the second temperature may range from 50° C. to 200° C. The process of depositing the third mask layer 9 (e.g., the polymer layer PL) may be performed at a pressure of, for example, 0 Torr to an ambient pressure. The fourth mask layer 11 may include, for example, a silicon oxynitride layer or a silicon nitride layer. The fifth mask pattern 13 may be, for example, a photoresist pattern.

Figure 1B:
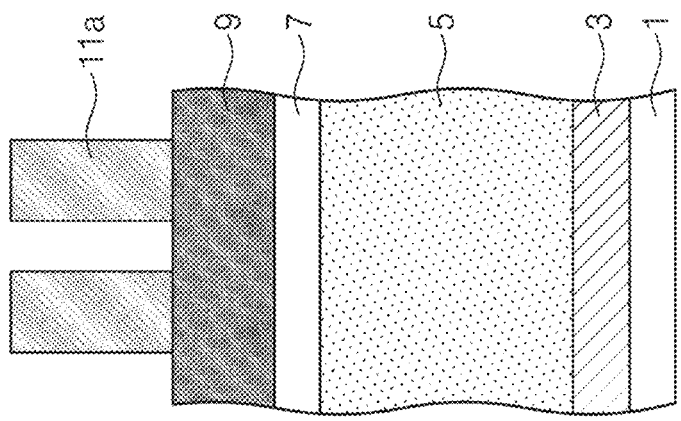
Figure 1C:
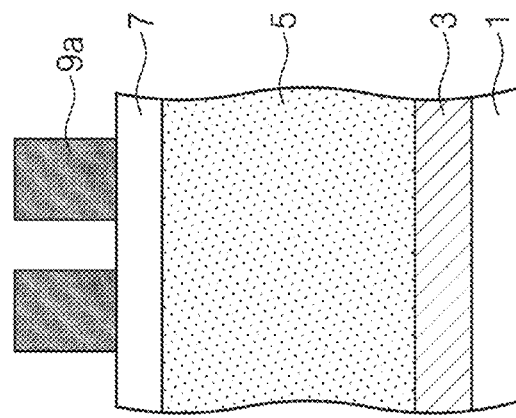

Referring to FIGS. 1B and 1C, the fourth mask layer 11 may be anisotropically etched using the fifth mask patterns 13 as etch masks to form fourth mask patterns 11a partially exposing the third mask layer 9. The third mask layer 9 may be etched using the fourth mask patterns 11a as etch masks to form third mask patterns 9a partially exposing the second mask layer 7. The third mask patterns 9a may be referred to as thermally decomposable patterns.

Referring to FIG. 1D, a sixth mask layer 15 may be formed on the third mask patterns 9a. The sixth mask layer 15 may cover top surfaces of the third mask patterns 9a and may fill a space between the third mask patterns 9a. The sixth mask layer 15 may be, for example, a spin-on-hard-mask (SOH) layer. A carbon-containing composite may be formed by a spin-coating method, and then, a baking process may be performed on the carbon-containing composite to form the SOH layer. The carbon-containing composite may include an organic compound and a solvent. The carbon-containing composite may further include an additive selected from a group comprising a crosslinking agent, a radical stabilizer, a surfactant, a pH adjuster, and a combination thereof. The organic compound may include a hydrocarbon compound or a derivative thereof, which includes an aromatic ring such as phenyl, benzene, or naphthalene. For example, the solvent may include at least one of propylene glycol monomethyl ether acetate (PGMEA), propylene glycol monomethyl ether (PGME), cyclohexanone, or ethyl lactate. The solvent included in the carbon-containing composite may be evaporated by the baking process.

Referring to FIGS. 1E and 2, the third mask patterns 9a may be removed to form gap regions GP in the sixth mask layer 15. Inner sidewalls of the sixth mask layer 15 may be exposed by the gap regions GP. The removal of the third mask patterns 9a may be performed by an annealing process. The annealing process may be performed at a temperature equal to or higher than a thermal decomposition temperature (e.g., the first temperature) of the material (e.g., the polymer layer PL) of the third mask patterns 9a.

The polymer layer PL may be decomposed into the first monomer M1 and the second monomer M2 by the annealing process. The first monomer M1 and the second monomer M2 may pass through the sixth mask layer 15 in a vapor state and may be released to the outside. In the annealing process, at least one gas of nitrogen, hydrogen, helium, or argon may be supplied as, for example, a carrier gas. The hydrogen may react with carbon of the thermally decomposable pattern (e.g., the third mask pattern 9a) to form a hydrocarbon compound of a low molecular weight (e.g., methane), and thus a thermal decomposition rate may be increased.

According to an example embodiment, the annealing process may be performed to remove the third mask patterns 9a. Alternatively, when the baking process is performed to form the sixth mask layer 15, the third mask patterns 9a may be thermally decomposed and thus may be removed. In this case, processes may be simplified.

Referring to FIG. 1F, an anisotropic etching process may be performed on the sixth mask layer 15 of FIG. 1E to remove the sixth mask layer 15 located on the gap regions GP, and thus the gap regions GP may be opened and sixth mask patterns 15a may be formed. The sixth mask patterns 15a may be spaced apart from each other.

Alternatively, as illustrated in FIG. 3, an anisotropic etching process may be performed on the sixth mask layer 15 of FIG. 1D to remove the sixth mask layer 15 located on the third mask patterns 9a, and thus sixth mask patterns 15a may be formed between the third mask patterns 9a. Thereafter, the annealing process may be performed to remove the third mask patterns 9a as described with reference to FIG. 1E, and thus sidewalls of the sixth mask patterns 15a may be exposed.

Figure 1G:
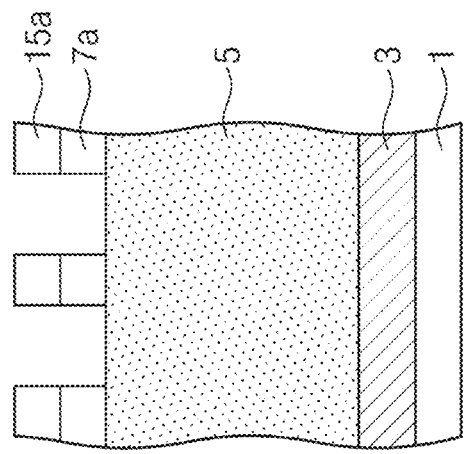
Figure 1H:
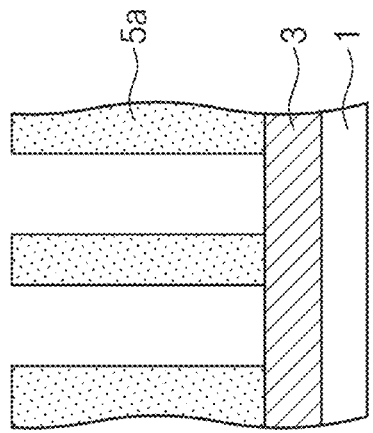
Figure 1I:
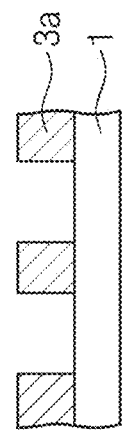

Subsequently, referring to FIGS. 1G to 1I, the second mask layer 7 may be etched using the sixth mask patterns 15a as etch masks to form second mask patterns 7a partially exposing a top surface of the first mask layer 5. The first mask layer 5 may be etched using the second mask patterns 7a as etch masks to form first mask patterns 5a partially exposing the etch target layer 3. The etch target layer 3 may be etched using the first mask patterns 5a as etch masks to form desired target patterns 3a.

According to an example embodiment described with reference to FIGS. 1A to 1I, 2 and 3, the third mask patterns 9a may be formed of the thermally decomposable material, and only the third mask patterns 9a may be decomposed by the annealing process without damage of surrounding structures. If the third mask patterns 9a are not formed of the thermally decomposable material, an additional etching process for removing the third mask patterns 9a should be performed. If this etching process is anisotropically performed, the sixth mask patterns 15a may be damaged by the etching process. In other words, upper portions of the sixth mask patterns 15a may also be removed by the etching process, and thus thicknesses of the sixth mask patterns 15a may be less than a desired thickness. In this case, it may be difficult to accurately form the second mask patterns 7a. If the etching process is isotropically performed, an etchant may permeate between the second mask layer 7 and the sixth mask patterns 15a to cause the lifting of the sixth mask patterns 15a. In this case, it may also be difficult to accurately form the second mask patterns 7a. However, according to an embodiment, the third mask patterns 9a may be formed of the thermally decomposable material, and thus the etch damage may be reduced or the lifting phenomenon of the mask pattern may be prevented or minimized. Therefore, a pattern profile after etching may be accurately formed. As a result, in the process of manufacturing the semiconductor device, process failure may be reduced and a yield may be improved.

FIGS. 4A to 4I are cross-sectional views illustrating a method of manufacturing a semiconductor device, according to some embodiments of the inventive concepts.

Figure 4A:
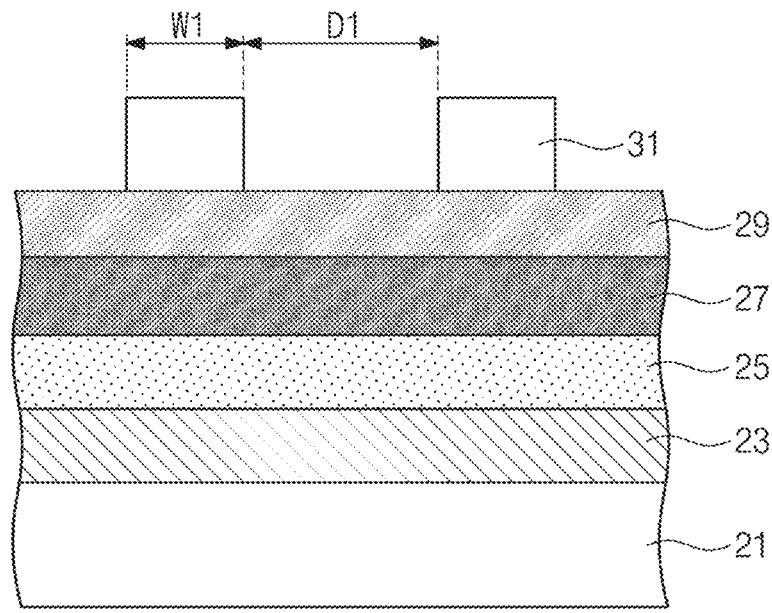
FIGS. 4A to 4I are cross-sectional views illustrating a method of manufacturing a semiconductor device, according to some embodiments of the inventive concepts.

Referring to FIG. 4A, an etch target layer 23, a first mask layer 25, a second mask layer 27 and a third mask layer 29 may be sequentially stacked on a substrate 21. Fourth mask patterns 31 may be formed on the third mask layer 29. The substrate 21 may be a semiconductor substrate or a silicon-on-insulator (SOI) substrate. Each of the etch target layer 23, the first to third mask layers 25, 27 and 29 and the fourth mask pattern 31 may include a material having an etch selectivity with respect to at least other(s) thereof, which is or are adjacent thereto. For example, the etch target layer 23 may include a metal such as tungsten. For example, the first mask layer 25 may include an amorphous carbon layer (ACL), a spin-on-hardmask (SOH) layer, a silicon nitride layer, or a silicon oxynitride layer.

The second mask layer 27 may include, for example, a thermally decomposable layer. A process of forming the second mask layer 27 may be the same or similar to the process as described with reference to FIG. 2. The third mask layer 29 may include, for example, a silicon nitride layer or a silicon oxynitride layer. The fourth mask patterns 31 may be photoresist patterns. Each of the fourth mask patterns 31 may have a first width W1. A distance between the fourth mask patterns 31 may be a first distance D1. For example, a ratio of the first width W1 to the first distance D1 may be about 3:5.

Figure 4B:
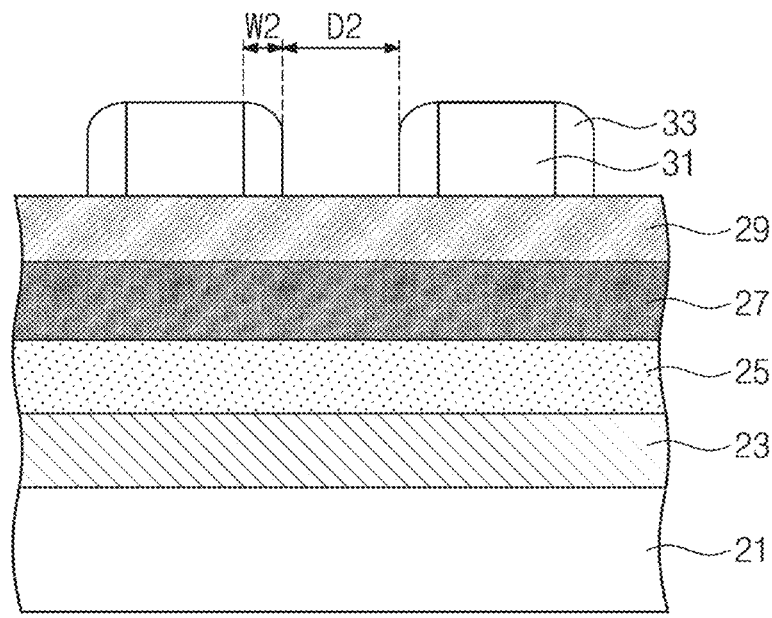

Referring to FIG. 4B, a first spacer layer may be conformally formed on an entire surface of the substrate 21, and then, an anisotropic etching process may be performed on the first spacer layer to form first spacers 33 covering sidewalls of the fourth mask patterns 31, respectively. The first spacers 33 may be formed of a material having an etch selectivity with respect to the third mask layer 29. For example, the first spacers 33 may be formed of silicon oxide. Each of the first spacers 33 may have a second width W2. For example, the second width W2 may correspond to about ⅓ of the first width W1 of FIG. 4A. A second distance D2 between the first spacers 33 adjacent to each other may be equal to the first width W1 of FIG. 4A.

Figure 4C:
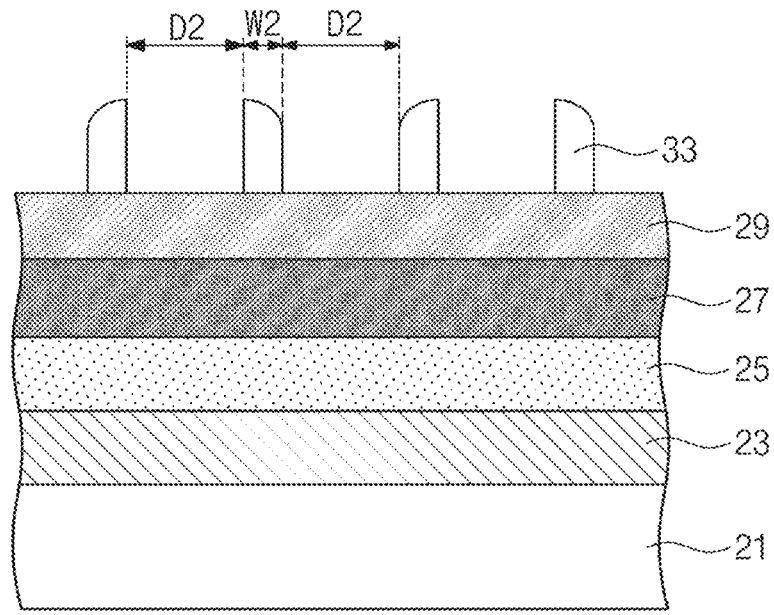
Figure 4D:
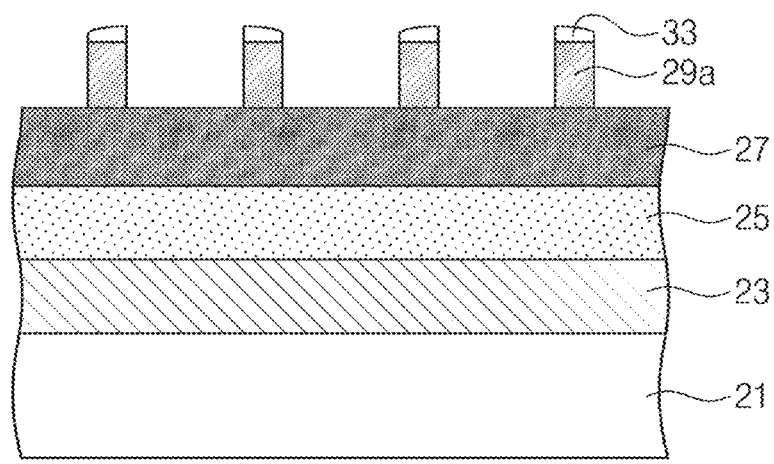

Referring to FIGS. 4C and 4D, the fourth mask patterns 31 may be removed to expose sidewalls of the first spacers 33. Distances between the first spacers 33 may be constant as the second distance D2. The third mask layer 29 may be etched using the first spacers 33 as etch masks to form third mask patterns 29a. Significant portions of the first spacers 33 may be removed by the etching process, and residual portions of the first spacers 33 may remain on the third mask patterns 29a.

Figure 4E:
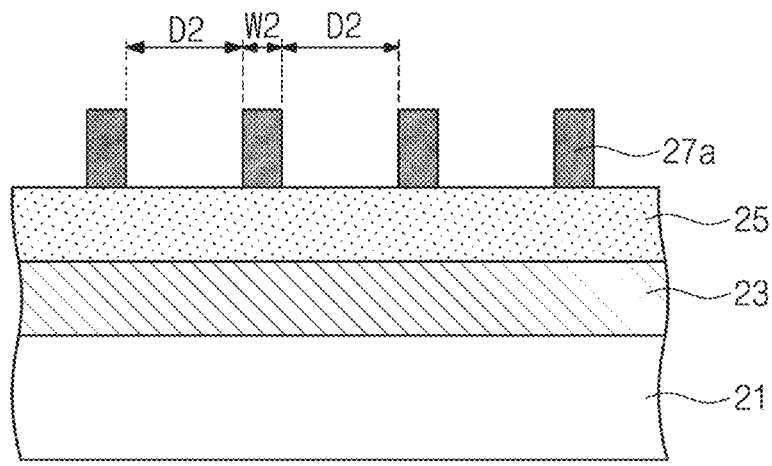

Referring to FIG. 4E, the second mask layer 27 may be etched using the third mask patterns 29a as etch masks to form second mask patterns 27a. The second mask patterns 27a may be referred to as thermally decomposable patterns. Each of the second mask patterns 27a may have the second width W2. A distance between the second mask patterns 27a may be equal to the second distance D2.

Figure 4F:
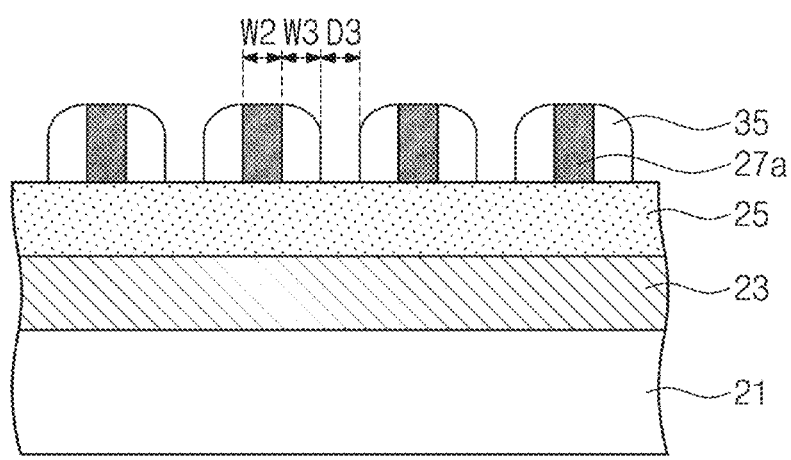

Referring to FIG. 4F, a second spacer layer may be conformally formed on an entire surface of the substrate 21, and then, an anisotropic etching process may be performed on the second spacer layer to form second spacers 35 covering sidewalls of the second mask patterns 27a, respectively. The second spacers 35 may be formed of a material having an etch selectivity with respect to the first mask layer 25. For example, the second spacers 35 may be formed of silicon oxide. Each of the second spacers 35 may have a third width W3. The third width W3 may be equal to the second width W2 of FIG. 4B. A third distance D3 between the second spacers 35 adjacent to each other may be equal to the third width W3.

Figure 4G:
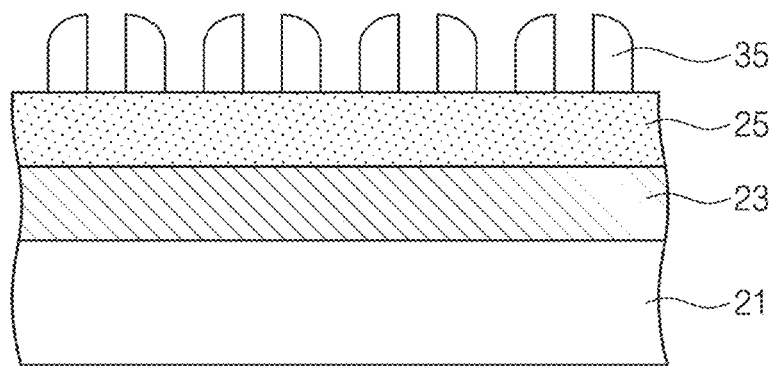

Referring to FIG. 4G, the second mask patterns 27a may be removed to expose sidewalls of the second spacers 35. The second mask patterns 27a may be removed by an annealing process. The thermally decomposable layer of the second mask patterns 27a may be thermally decomposed as described with reference to FIG. 2.

Figure 4H:
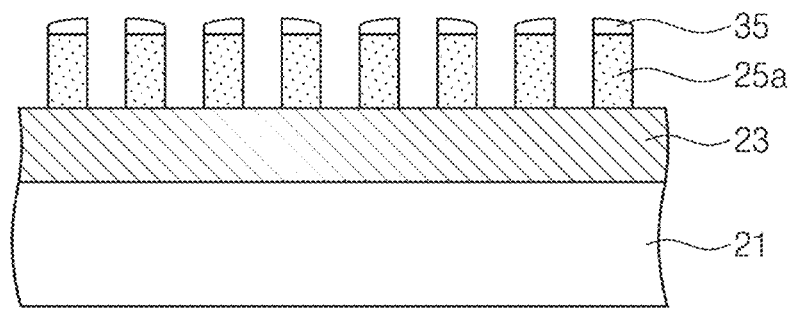
Figure 4I:
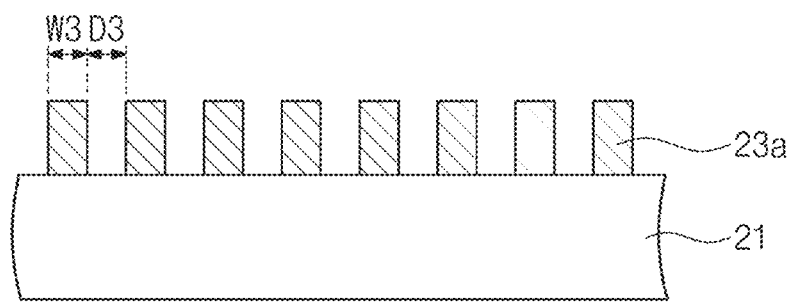

Referring to FIGS. 4H and 4I, the first mask layer 25 may be anisotropically etched using the second spacers 35 as etch masks to form first mask patterns 25a. The etch target layer 23 may be etched using the first mask patterns 25a as etch masks to form target patterns 23a. At this time, each of the target patterns 23a may have the third width W3 of FIG. 4F. A distance between the target patterns 23a may correspond to the third distance D3 of FIG. 4F. The third width W3 may be equal to the third distance D3.

According to an example embodiment described with reference to FIGS. 4A to 4I, the second mask patterns 27a may be formed of the thermally decomposable material, and only the second mask patterns 27a may be decomposed by the annealing process without damage of surrounding structures. Thus, as described above, the etch damage may be reduced or the lifting phenomenon of the mask pattern may be solved. Accordingly, a pattern profile after etching may be accurately formed. As a result, in the process of manufacturing the semiconductor device, process failure may be reduced and a yield may be improved.

FIGS. 5A to 5G are cross-sectional views illustrating a method of manufacturing a semiconductor device, according to some embodiments of the inventive concepts.

Figure 5A:
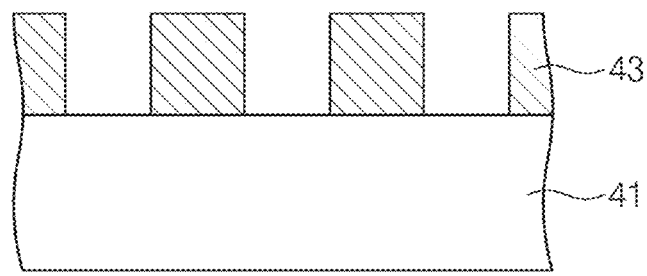
FIGS. 5A to 5G are cross-sectional views illustrating a method of manufacturing a semiconductor device, according to some embodiments of the inventive concepts.

Referring to FIG. 5A, conductive patterns spaced apart from each other may be formed on a substrate 41. The conductive patterns may be referred to as first interconnection patterns 43. Even though not shown in the drawings, an interlayer insulating layer, transistors and interconnection structures may be between the substrate 41 and the first interconnection patterns 43. The substrate 41 may be a semiconductor substrate or a SOI substrate. The first interconnection patterns 43 may include a metal such as tungsten, copper, and/or aluminum. Even though not shown in the drawings, each of the first interconnection patterns 43 may further include a diffusion barrier layer including a metal nitride layer such as a titanium nitride layer, a tantalum nitride layer, or a tungsten nitride layer.

Figure 5B:
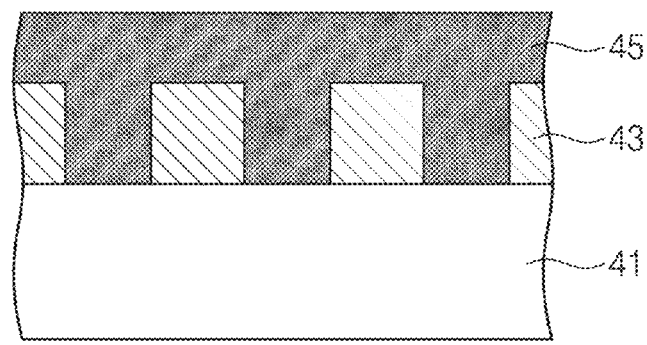

Referring to FIG. 5B, a thermally decomposable layer 45 may be formed on the first interconnection patterns 43. The thermally decomposable layer 45 may be formed by the process described with reference to FIG. 2. The thermally decomposable layer 45 may fill a space between the first interconnection patterns 43.

Figure 5C:
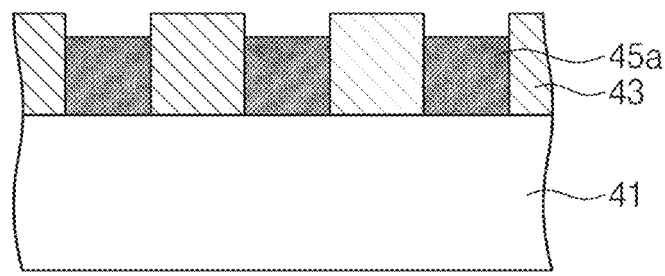

Referring to FIG. 5C, an upper portion of the thermally decomposable layer 45 may be removed by performing a first annealing process, thereby exposing upper portions of the first interconnection patterns 43 and forming thermally decomposable patterns 45a between the first interconnection patterns 43. The thermally decomposable patterns 45a may be spaced apart from each other. A time, a temperature and/or a pressure of the first annealing process may be adjusted in such a way that the thermally decomposable layer 45 is not completely removed but the thermally decomposable patterns 45a remain.

Figure 5D:
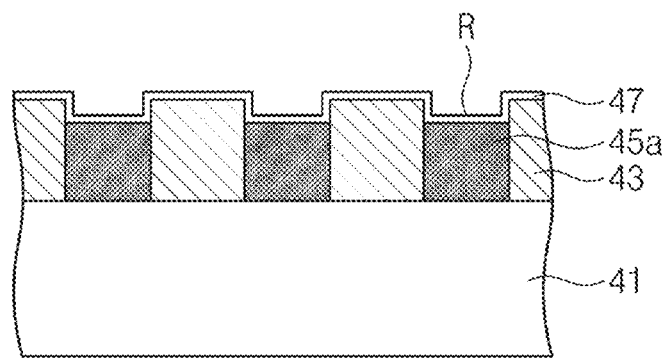

Referring to FIG. 5D, a first capping layer 47 may be conformally formed on an entire surface of the substrate 41. The first capping layer 47 may have a single-layered or multi-layered structure including at least one of a silicon oxide layer, a silicon nitride layer, a silicon oxynitride layer, or a porous insulating layer. The first capping layer 47 may have an appropriate thickness so as not to fill spaces on the thermally decomposable patterns 45a between the first interconnection patterns 43. Thus, a cross section of the first capping layer 47 may have an uneven structure, and the first capping layer 47 may have recess regions R on the thermally decomposable patterns 45a.

Figure 5E:
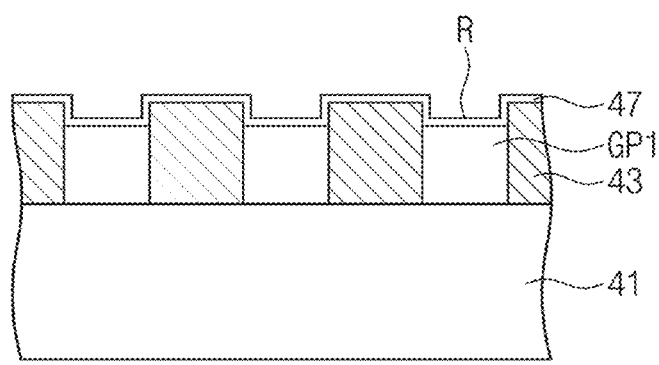

Referring to FIG. 5E, a second annealing process may be performed to remove the thermally decomposable patterns 45a, and thus first gap regions GP1 may be formed between the first interconnection patterns 43. The first gap region GP1 may expose sidewalls of lower portions of the first interconnection patterns 43, a bottom surface of the first capping layer 47, and a top surface of the substrate 41. The thermally decomposable patterns 45a may be thermally decomposed into the first monomers M1 of FIG. 2 and the second monomers M2 of FIG. 2 by the second annealing process. The first and second monomers in a vapor state may be released to the outside through the first capping layer 47.

Figure 5F:
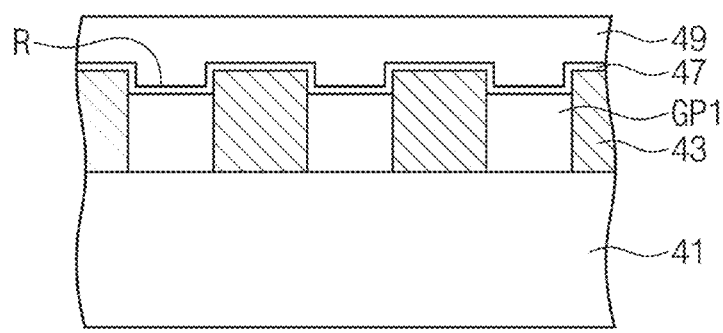

Referring to FIG. 5F, a second capping layer 49 may be formed on the first capping layer 47. The second capping layer 49 may have a single-layered or multi-layered structure including at least one of a silicon oxide layer, a silicon nitride layer, a silicon oxynitride layer, or a porous insulating layer. The second capping layer 49 may be thicker than the first capping layer 47. The second capping layer 49 may fill spaces (e.g., the recess regions R) between the first interconnection patterns 43 on the first capping layer 47 located on the first gap regions GP1.

The first capping layer 47 and the second capping layer 49 may be removed from the interconnection patterns 53, exposing the top surface of the interconnection patterns 53. The exposed region of the interconnection patterns 53 can be further processed to form an upper conductive pattern. The upper conductive pattern (not shown) may be in contact with the interconnection patterns 53.

Figure 5G:
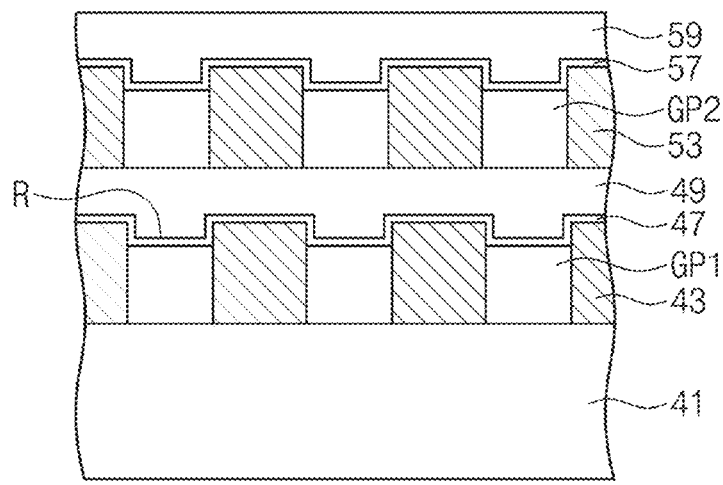

Referring to FIG. 5G, second interconnection patterns 53, a third capping layer 57, second gap regions GP2 and a fourth capping layer 59 may be formed on the second capping layer 49. The third capping layer 57 may be formed by the same or similar process as the first capping layer 47. The second gap regions GP2 may be formed by the same or similar process as the first gap regions GP1. The fourth capping layer 59 may be formed by the same or similar process as the second capping layer 49.

The densities of the first and third capping layers 47 and 57 may be less than the densities of the second and fourth capping layers 49 and 59, respectively. The porosities of the first and third capping layers 47 and 57 may be greater than the porosities of the second and fourth capping layers 49 and 59, respectively. Thus, when the first and second gap regions GP1 and GP2 are formed, the vapor may easily pass through the first and third capping layers 47 and 57. The second and fourth capping layers 49 and 59 may support the first and second interconnection patterns 43 and 53.

In the semiconductor device of FIG. 5G, the first capping layer 47 may cover the top surfaces of the first interconnection patterns 43 and the sidewalls of upper portions of the first interconnection patterns 43. The first capping layer 47 may connect the sidewalls of the upper portions of the first interconnection patterns 43. The first gap region GP1 may be formed between the sidewalls of the lower portions of the first interconnection patterns 43. The first capping layer 47 may have the recess region R on the first gap region GP1. The recess region R may be filled with the second capping layer 49. The second capping layer 49 can act as support for second interconnection patterns 53. In the semiconductor device, the first gap region GP1 may exist between the first interconnection patterns 43, and a second gap region GP2 may exist between the second interconnection patterns 53. Thus, it is possible to reduce signal interference between the first interconnection patterns 43 and between the second interconnection patterns 53. As a result, a signal transmission speed may be improved.

Figure 6:
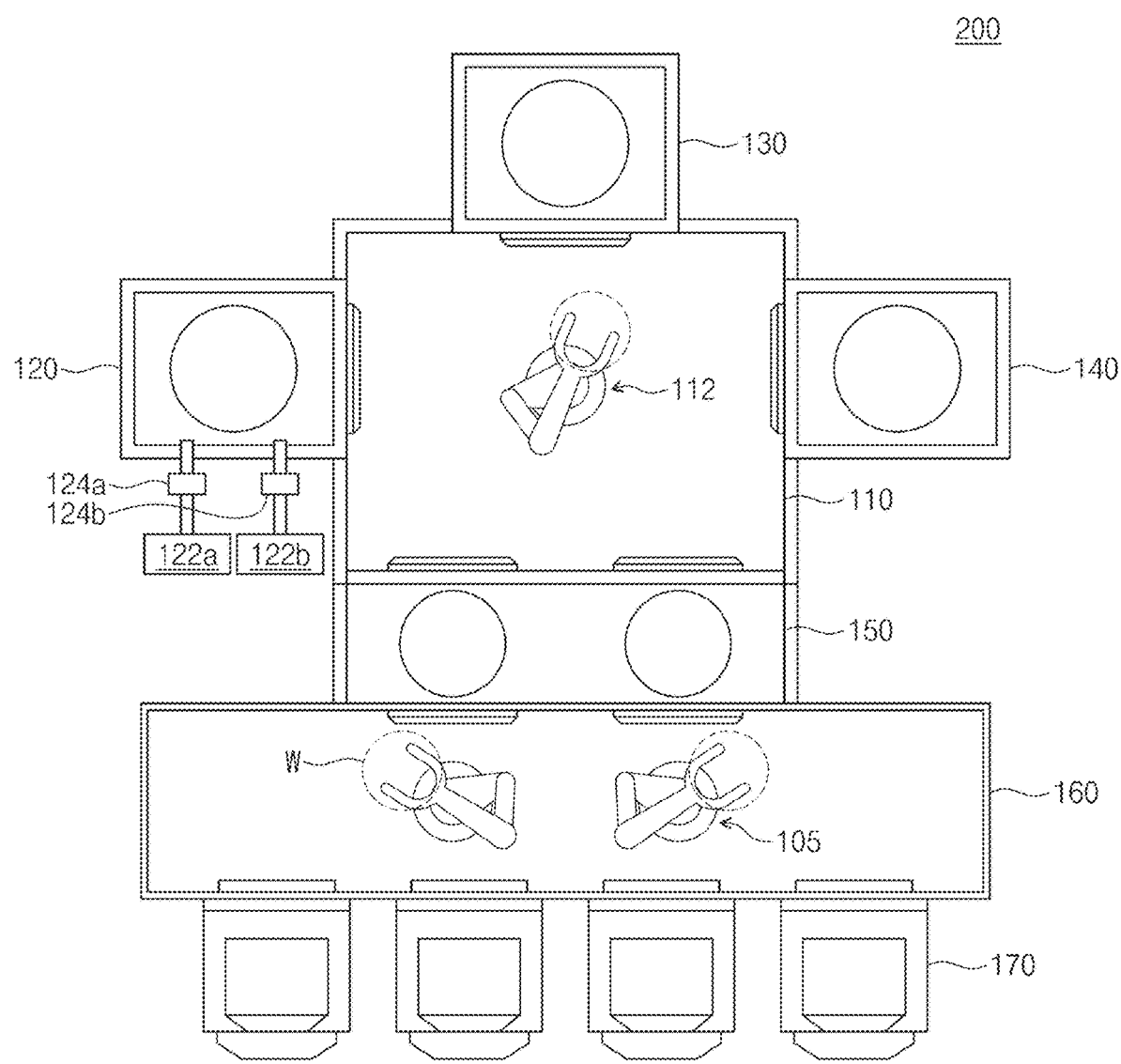
FIG. 6 is a plan view illustrating a semiconductor manufacturing apparatus according to some embodiments of the inventive concepts.
Figure 7:
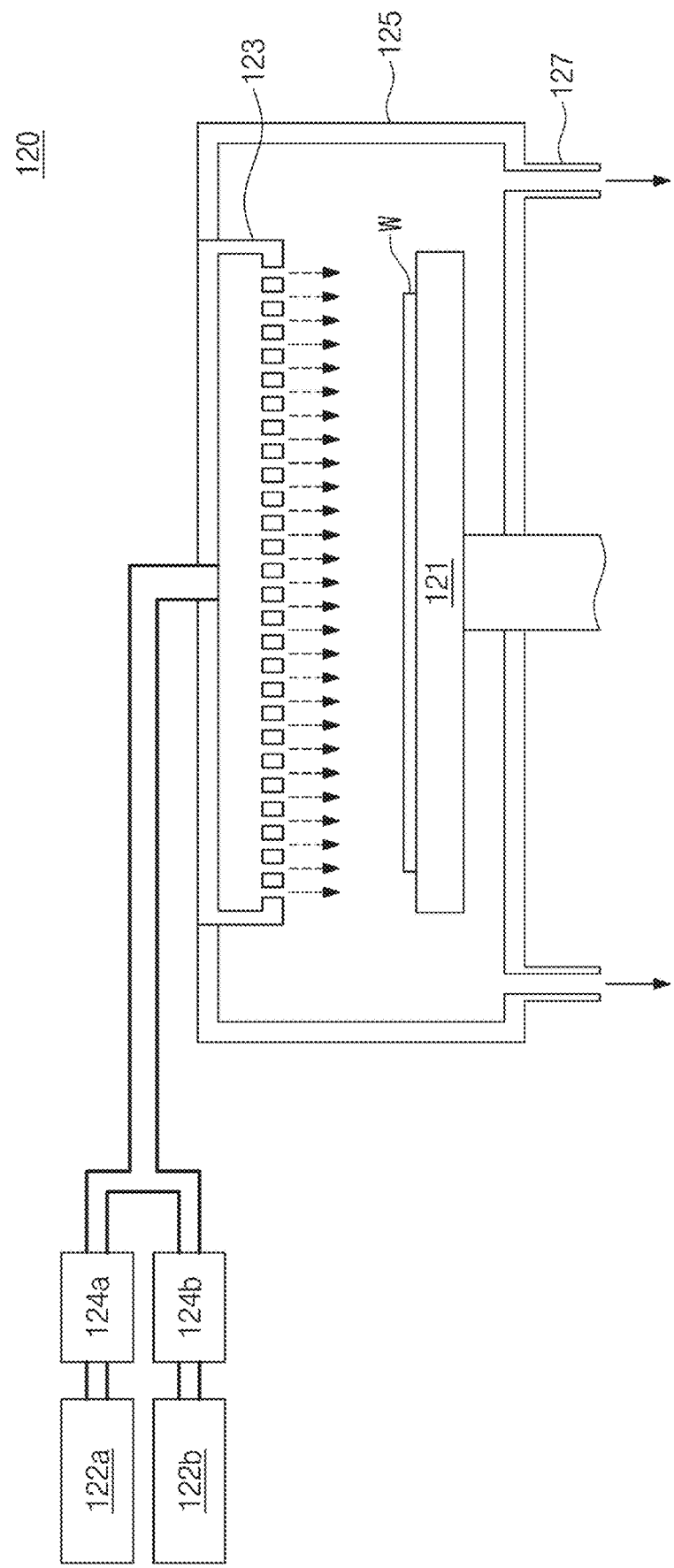
FIG. 7 is a cross-sectional view of a thermally decomposable layer deposition chamber.

FIG. 6 is a plan view illustrating a semiconductor manufacturing apparatus according to some embodiments of the inventive concepts. FIG. 7 is a cross-sectional view of a thermally decomposable layer deposition chamber.

Referring to FIGS. 6 and 7, a semiconductor manufacturing apparatus 200 according to some embodiments of the inventive concepts may include a first transfer chamber 110. At least one first robot arm 112 may be in the first transfer chamber 110. At least one thermally decomposable layer deposition chamber 120 may be connected to the first transfer chamber 110. The thermally decomposable layer deposition chamber 120 may have a structure of a plasma-enhanced chemical vapor deposition (PECVD) apparatus, a mini batch-type apparatus or a thermal deposition apparatus.

In some embodiments, the thermally decomposable layer deposition chamber 120 may include a chamber wall 125, a wafer receiving unit 121 on which a wafer W is received, and a shower head 123 disposed over the wafer receiving unit 121. The wafer receiving unit 121 may be rotatable. An exhaust pipe 127 may be located at a side of the wafer receiving unit 121 and below the wafer receiving unit 121. A first monomer storage container 122a and a second monomer storage container 122b may be connected to the shower head 123 of the thermally decomposable layer deposition chamber 120. A first vaporizer 124a may be between the first monomer storage container 122a and the shower head 123. A second vaporizer 124b may be between the second monomer storage container 122b and the shower head 123. The first monomer M1 described with reference to FIG. 2 may be stored in the first monomer storage container 122a. The second monomer M2 described with reference to FIG. 2 may be stored in the second monomer storage container 122b.

The first and second monomers M1 and M2 may be vaporized by the first and second vaporizers 124a and 124b, respectively, and thus the first and second monomers M1 and M2 in a vapor state may be supplied into the shower head 123. The first and second monomers M1 and M2 injected through the shower head 123 may be supplied onto a wafer W located on the wafer receiving unit 121 and may react and cross-link with each other to deposit the thermally decomposable layer PL described with reference to FIG. 2. Unreacted first and second monomers M1 and M2 may be exhausted to the outside through the exhaust pipe 127.

Heaters may be in or near the chamber wall 125 and the wafer receiving unit 121 to maintain temperatures of the chamber wall 125 and the wafer receiving unit 121 at a process temperature for depositing the thermally decomposable layer. When a temperature at which the thermally decomposable layer PL is thermally decomposed is defined as a first temperature, a second temperature corresponding to the process temperature in the thermally decomposable layer deposition chamber 120 may be lower than the first temperature. For example, the second temperature may range from 50° C. to 200° C. For example, a pressure in the thermally decomposable layer deposition chamber 120 may range from 0 Torr to an ambient pressure. Even though not shown in the drawings, the thermally decomposable layer deposition chamber 120 may further include a device (e.g., an electric coil or an electrode) for generating plasma.

At least one annealing chamber 130 may be connected to the first transfer chamber 110. A pipe for supplying a carrier gas (e.g., hydrogen, nitrogen, argon, and/or helium) may be additionally connected to the annealing chamber 130. The annealing chamber 130 may decompose the thermally decomposable layer deposited in the thermally decomposable layer deposition chamber 120 and thus may remove a portion or the whole of the thermally decomposable layer. A third temperature corresponding to a process temperature of the annealing chamber 130 may be higher than the first temperature. In some embodiments, a pressure in the annealing chamber 130 may be less than a vapor pressure of the material of the thermally decomposable layer at the first temperature.

At least one capping layer deposition chamber 140 may be connected to the first transfer chamber 110. The capping layer deposition chamber 140 may have a structure of a plasma-enhanced chemical vapor deposition (PECVD) apparatus, a mini batch-type apparatus or a thermal deposition apparatus. The capping layer deposition chamber 140 may deposit a silicon oxide layer, a silicon nitride layer, a silicon oxynitride layer, or a porous insulating layer.

A second transfer chamber 160 may be connected to the first transfer chamber 110. At least one second robot arm 105 may be in the second transfer chamber 160. A station chamber 150 may be between the first transfer chamber 110 and the second transfer chamber 160. A plurality of wafer cassettes 170 may be mounted to the second transfer chamber 160.

The processes of FIGS. 5A to 5F may be performed using the semiconductor manufacturing apparatus 200. This will be described hereinafter in detail.

A wafer in the wafer cassette 170 may be transferred into the station chamber 150 by the second robot arm 105. The first interconnection patterns 43 of FIG. 5A may be formed on the wafer. The first robot arm 112 may transfer the wafer located in the station chamber 150 into the thermally decomposable layer deposition chamber 120. In the thermally decomposable layer deposition chamber 120, the thermally decomposable layer 45 may be formed as described with reference to FIG. 5B. The first robot arm 112 may unload the wafer having the thermally decomposable layer 45 from the thermally decomposable layer deposition chamber 120 and then may load the wafer into the annealing chamber 130. In the annealing chamber 130, an upper portion of the thermally decomposable layer 45 may be thermally decomposed and removed to form the thermally decomposable pattern 45a, as described with reference to FIG. 5C. The first robot arm 112 may unload the wafer from the annealing chamber 130 and then may load the wafer into the capping layer deposition chamber 140. In the capping layer deposition chamber 140, the first capping layer 47 may be formed as described with reference to FIG. 5D. The first robot arm 112 may unload the wafer from the capping layer deposition chamber 140 and then may load the wafer into the annealing chamber 130. In the annealing chamber 130, the thermally decomposable pattern 45a may be thermally decomposed and removed to form the first gap region GP1, as described with reference to FIG. 5E. The first robot arm 112 may unload the wafer from the annealing chamber 130 and then may load the wafer into the capping layer deposition chamber 140. In the capping layer deposition chamber 140, the second capping layer 49 may be formed as described with reference to FIG. 5F. The wafer on which the second capping layer 49 is formed may be transferred into the station chamber 150 by the first robot arm 112 and may be cooled to a room temperature level in the station chamber 150. Next, the wafer may be transferred into the wafer cassette 170 by the second robot arm 105.

The semiconductor manufacturing apparatus 200 according to the embodiments of the inventive concepts may include the thermally decomposable layer deposition chamber 120, the annealing chamber 130, and the capping layer deposition chamber 140 as a single cluster, and thus the processes may be simplified and vacuum break (e.g., a time required to make vacuum) may be eliminated. As a result, a total process time may be reduced.

Figure 8:
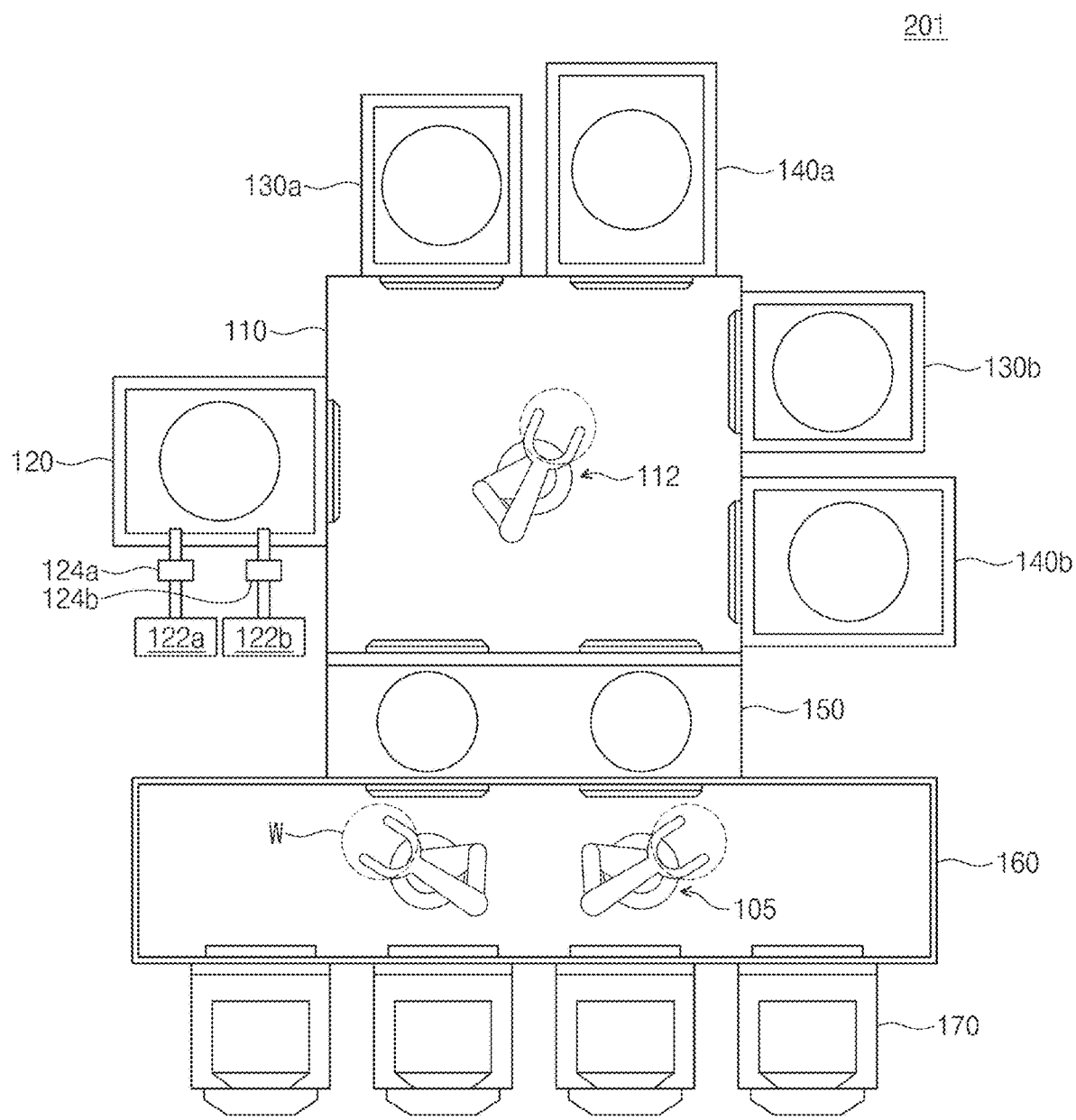
FIG. 8 is a plan view illustrating a semiconductor manufacturing apparatus according to some embodiments of the inventive concepts.

FIG. 8 is a plan view illustrating a semiconductor manufacturing apparatus according to some embodiments of the inventive concepts.

Referring to FIG. 8, a semiconductor manufacturing apparatus 201 according to some embodiments of the inventive concepts may include a first transfer chamber 110. At least one thermally decomposable layer deposition chamber 120 may be connected to the first transfer chamber 110. The thermally decomposable layer deposition chamber 120 may be the same or similar as described with reference to FIGS. 6 and 7. A first annealing chamber 130a, a first capping layer deposition chamber 140a, a second annealing chamber 130b and a second capping layer deposition chamber 140b may be connected to the first transfer chamber 110. The first annealing chamber 130a and the second annealing chamber 130b may be the same or similar as the annealing chamber 130 described with reference to FIG. 6. The first and second capping layer deposition chambers 140a and 140b may be the same or similar as the capping layer deposition chamber 140 described with reference to FIG. 6.

The first annealing chamber 130a may be used to remove (or recess) the upper portion of the thermally decomposable layer 45 like FIG. 5C. The first capping layer deposition chamber 140a may be used to deposit the first capping layer 47 of FIG. 5D. The second annealing chamber 130b may be used to remove the thermally decomposable pattern 45a like FIG. 5E. The second capping layer deposition chamber 140b may be used to deposit the second capping layer 49 of FIG. 5F. Other components and operations of the semiconductor manufacturing apparatus 201 may be the same or similar as described with reference to FIG. 6.

Although not illustrated, the semiconductor manufacturing apparatuses 200 and 201 may further include an electronic controller and a memory connected through a bus. The memory may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM). The electronic controller may be, a central processing unit (CPU), a processor, an application-specific integrated circuit (ASIC), or another suitable hardware processing unit, that when, executing instructions stored in the memory, configures the controller as a special purpose controller for controlling the semiconductor manufacturing apparatuses 200 and 201 to perform one or more of the above-described manufacturing processes described above in relation to the semiconductor manufacturing apparatuses 200 and 201, the thermally decomposable layer deposition chamber 120, the annealing chamber 130, the capping layer deposition chamber 140 and the robotic arms 105 and 112 in FIGS. 6 and 8.

Figure 9:
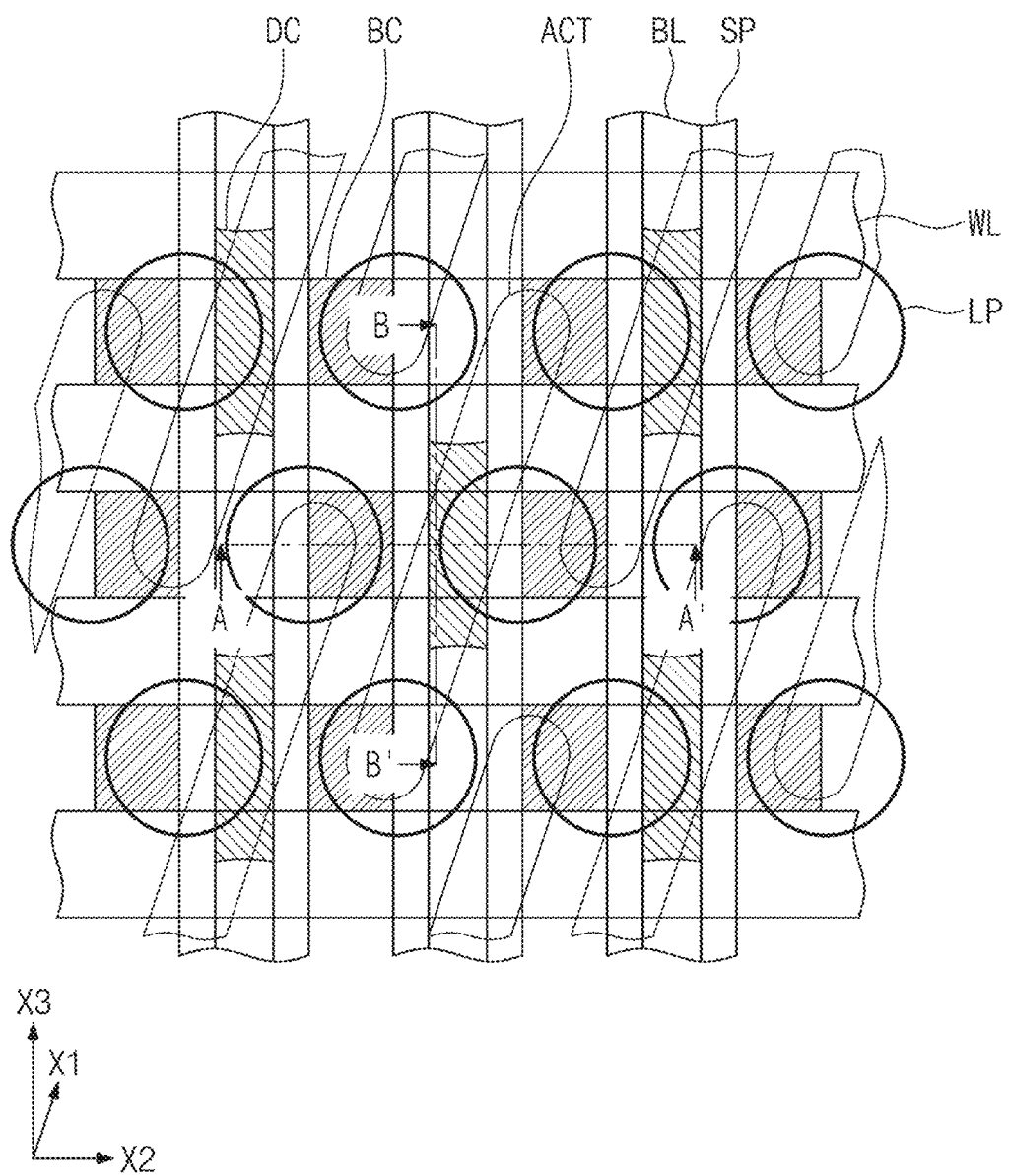
FIG. 9 is a plan view illustrating a semiconductor device according to some embodiments of the inventive concepts.
Figure 10:
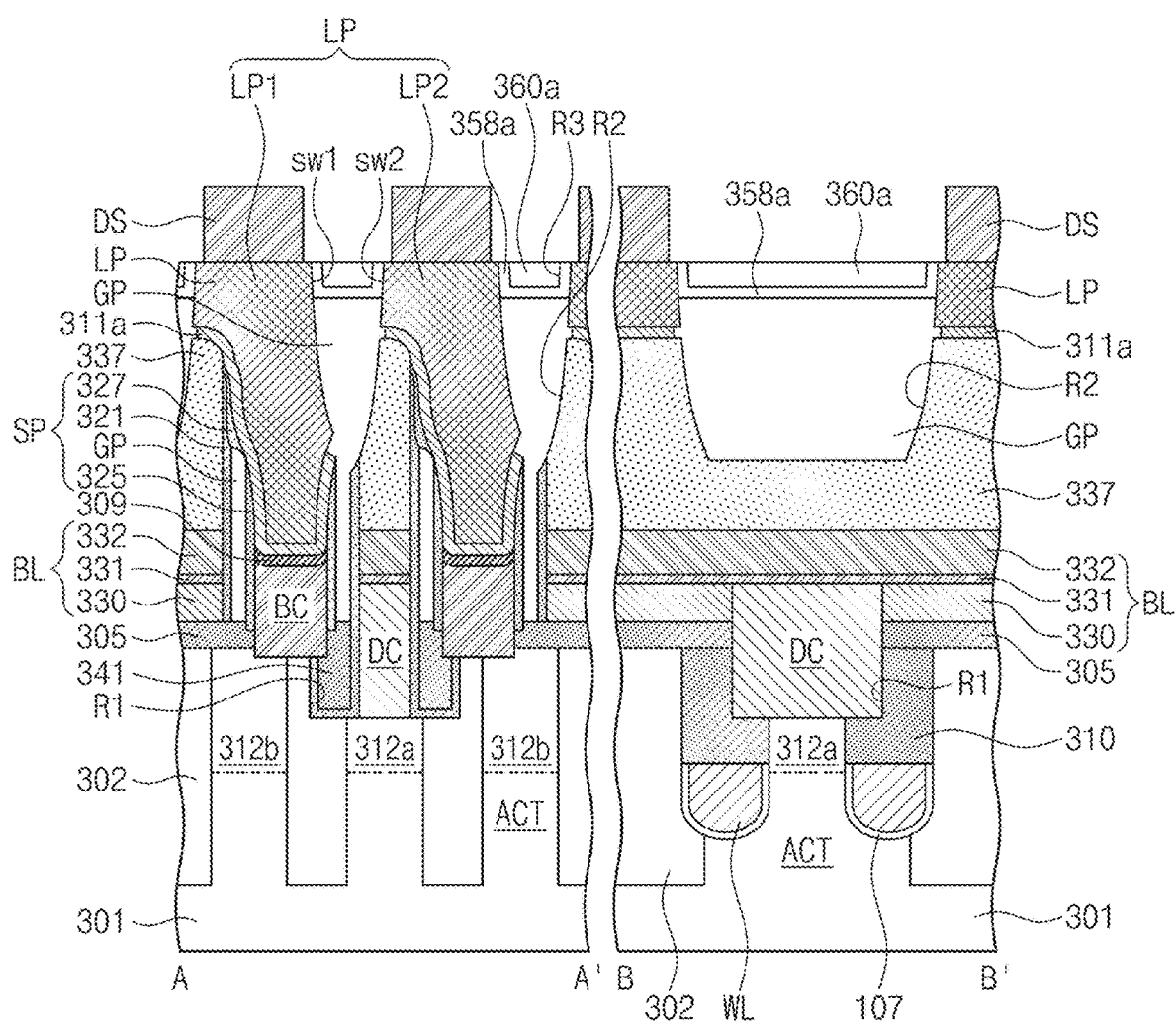
FIG. 10 is a cross-sectional view taken along lines A-A' and B-B' of FIG. 9.

FIG. 9 is a plan view illustrating a semiconductor device according to some embodiments of the inventive concepts. FIG. 10 is a cross-sectional view taken along lines A-A' and B-B' of FIG. 9.

Referring to FIGS. 9 and 10, a device isolation pattern 302 may be in a substrate 301 to define active portions ACT. Each of the active portions ACT may have an isolated shape when viewed in a plan view. Each of the active portions ACT may have a bar shape extending in a first direction X1 when viewed in a plan view. Each of the active portions ACT may correspond to a portion of the substrate 301, which is surrounded by the device isolation pattern 302 when viewed in a plan view. The substrate 301 may include a semiconductor material. For example, the substrate 301 may be a silicon substrate, a germanium substrate, or a silicon-germanium substrate. The device isolation pattern 302 may include at least one of an oxide (e.g., silicon oxide), a nitride (e.g., silicon nitride), or an oxynitride (e.g., silicon oxynitride). The active portions ACT may be parallel to each other in the first direction X1 and may be arranged such that an end portion of each active portion ACT is adjacent to a central portion of another active portion ACT adjacent thereto.

Word lines WL may intersect the active portions ACT. The word lines WL may be in grooves formed in the device isolation pattern 302 and the active portions ACT. The word lines WL may be parallel to a second direction X2 intersecting the first direction X1. The word lines WL may be formed of a conductive material. A gate dielectric layer 107 may be between each of the word lines WL and an inner surface of each of the grooves. Even though not shown in the drawings, bottoms of the grooves may be relatively deep in the device isolation pattern 302 and may be relatively shallow in the active portions ACT. The gate dielectric layer 107 may include at least one of a thermal oxide, silicon nitride, silicon oxynitride, or a high-k dielectric material. Bottom surfaces of the word lines WL may be rounded.

A first doped region 312a may be in each of the active portions ACT between a pair of the word lines WL, and a pair of second doped regions 312b may be in both edge regions of each of the active portions ACT, respectively. The first and second doped regions 312a and 312b may be doped with, for example, N-type dopants. The first doped region 312a may correspond to a common drain region, and the second doped regions 312b may correspond to source regions. Each of the word lines WL and the first and second doped regions 312a and 312b adjacent thereto may constitute a transistor. Since the word lines WL are in the grooves, a channel length of a channel region under the word line WL may be increased in a limited planar area. Thus, a short channel effect may be minimized.

Top surfaces of the word lines WL may be lower than top surfaces of the active portions ACT. A word line capping pattern 310 may be on each of the word lines WL. The word line capping patterns 310 may have line shapes extending in a longitudinal direction of the word lines WL and may fully cover the top surfaces of the word lines WL. The word line capping patterns 310 may fill the grooves on the word lines WL. The word line capping patterns 310 may be formed of, for example, silicon nitride.

An interlayer insulating pattern 305 may be on the substrate 301. The interlayer insulating pattern 305 may be formed of a single or multi-layer including at least one of a silicon oxide layer, a silicon nitride layer, or a silicon oxynitride layer. The interlayer insulating pattern 305 may have island shapes spaced apart from each other in a plan view. The interlayer insulating pattern 305 may cover end portions of two active portions ACT adjacent to each other.

The substrate 301, the device isolation pattern 302 and an upper portion of the word line capping pattern 310 may be partially recessed to form a first recess region R1. The first recess region R1 may have a mesh shape in a plan view of FIG. 9. A sidewall of the first recess region R1 may be aligned with a sidewall of the interlayer insulating pattern 305.

Bit lines BL may be on the interlayer insulating pattern 305. The bit lines BL may intersect the word line capping patterns 310 and the word lines WL. As illustrated in FIG. 9, the bit lines BL may be parallel to a third direction X3 intersecting the first and second directions X1 and X2. Each of the bit lines BL may include a bit line poly-silicon pattern 330, a bit line ohmic pattern 331, and a bit line metal-containing pattern 332, which are sequentially stacked. The bit line poly-silicon pattern 330 may include poly-silicon doped or not doped with dopants. The bit line ohmic pattern 331 may include a metal silicide layer. The bit line metal-containing pattern 332 may include at least one of a metal (e.g., tungsten, titanium, or tantalum) or a conductive metal nitride (e.g., titanium nitride, tantalum nitride, or tungsten nitride). A bit line capping pattern 337 may be on each of the bit lines BL. The bit line capping patterns 337 may be formed of an insulating material. For example, the bit line capping patterns 337 may include at least one of a nitride (e.g., silicon nitride) or an oxynitride (e.g., silicon oxynitride).

Bit line contacts DC may be in the first recess region R1 intersecting the bit lines BL. The bit line contacts DC may include poly-silicon doped or not doped with dopants. In a cross section B-B' of FIG. 10, a sidewall of the bit line contact DC may be in contact with a sidewall of the interlayer insulating pattern 305. In the plan view of FIG. 9, the sidewall of the bit line contact DC, which is in contact with the interlayer insulating pattern 305, may be concave. The bit line contact DC may electrically connect the first doped region 312a to the bit line BL.

A lower filling insulation pattern 341 may be in the first recess region R1 in which the bit line contact DC is not disposed. The lower filling insulation pattern 341 may be formed of a single or multi-layer including at least one of a silicon oxide layer, a silicon nitride layer, or a silicon oxynitride layer.

Storage node contacts BC may be between a pair of the bit lines BL adjacent to each other. The storage node contacts BC may be spaced apart from each other. The storage node contacts BC may include poly-silicon doped or not doped with dopants. Top surfaces of the storage node contacts BC may be concave. An insulating pattern (not shown) may be between the storage node contacts BC between the bit lines BL.

A bit line spacer SP may be between the bit line BL and the storage node contact BC. The bit line spacer SP may include a first sub-spacer 321 and a second sub-spacer 325, which are spaced apart from each other by a gap region GP. The gap region GP may be referred to as an air gap region. The first sub-spacer 321 may cover a sidewall of the bit line BL and a sidewall of the bit line capping pattern 337. The second sub-spacer 325 may be adjacent to the storage node contact BC. The first sub-spacer 321 and the second sub-spacer 325 may include the same material. For example, the first sub-spacer 321 and the second sub-spacer 325 may include silicon nitride.

A bottom surface of the second sub-spacer 325 may be lower than a bottom surface of the first sub-spacer 321. A height of a top end of the second sub-spacer 325 may be lower than a height of a top end of the first sub-spacer 321. Thus, a margin of a subsequent process of forming a landing pad LP may be increased. As a result, it is possible to prevent disconnection between the landing pad LP and the storage node contact BC. The first sub-spacer 321 may extend to cover a sidewall of the bit line contact DC and a sidewall and a bottom surface of the first recess region R1. In other words, the first sub-spacer 321 may be between the bit line contact DC and the lower filling insulation pattern 341, between the word line capping pattern 310 and the lower filling insulation pattern 341, between the substrate 301 and the lower filling insulation pattern 341, and between the device isolation pattern 302 and the lower filling insulation pattern 341.

A storage node ohmic layer 309 may be on the storage node contact BC. The storage node ohmic layer 309 may include a metal silicide. A diffusion barrier pattern 311a may conformally cover the storage node ohmic layer 309, the first and second sub-spacers 321 and 325, and the bit line capping pattern 337. The diffusion barrier pattern 311a may include a metal nitride such as titanium nitride or tantalum nitride. A landing pad LP may be on the diffusion barrier pattern 311a. The landing pad LP may be formed of a metal-containing material such as tungsten, and may be referred to as a conductive pattern. An upper portion of the landing pad LP may cover a top surface of the bit line capping pattern 337 and may have a width greater than that of the storage node contact BC. A center of the landing pad LP may be shifted from a center of the storage node contact BC in the second direction X2. A portion of the bit line BL may vertically overlap with the landing pad LP. One upper sidewall of the bit line capping pattern 337 may overlap with the landing pad LP and may be covered with a third sub-spacer 327. A second recess region R2 may be formed at another upper sidewall of the bit line capping pattern 337.

The landing pads LP may include a first landing pad LP1 and a second landing pad LP2, which are adjacent to each other. The first landing pad LP1 may have a first upper sidewall sw1 adjacent to the second landing pad LP2. The second landing pad LP2 may have a second upper sidewall sw2 adjacent to the first upper sidewall sw1. A first capping pattern 358a may cover the first and second upper sidewalls sw1 and sw2 and may connect the first and second upper sidewalls sw1 and sw2. The first capping pattern 358a may have a substantially uniform thickness. The first capping pattern 358a may have or define a third recess region R3 between the first and second landing pads LP1 and LP2. The third recess region R3 may be filled with a second capping pattern 360a. Each of the first and second capping patterns 358a and 360a may independently include a silicon nitride layer, a silicon oxide layer, a silicon oxynitride layer, or a porous layer. A porosity of the first capping pattern 358a may be greater than a porosity of the second capping pattern 360a. Top surfaces of the first and second capping patterns 358a and 360a may be coplanar with top surfaces of the landing pads LP.

The gap region GP between the first and second sub-spacers 321 and 325 may extend between the first and second landing pads LP1 and LP2. A bottom surface of the first capping pattern 358a may be exposed by the gap region GP. The gap region GP may extend toward the diffusion barrier pattern 311a. In other words, a sidewall of the diffusion barrier pattern 311a between the second landing pad LP2 and the bit line capping pattern 337 may be recessed. The top surface of the bit line capping pattern 337 and a bottom surface of the second landing pad LP2 may be partially exposed by the gap region GP.

A data storage pattern DS may be on the landing pad LP. The data storage pattern DS may be a lower electrode of a capacitor or may be a phase change material pattern, a variable resistance material pattern, or a magnetic tunnel junction pattern.

In the semiconductor device according to the embodiments of the inventive concepts, the gap region GP may not be closed at top ends of the first and second sub-spacers 321 and 325 but may extend between the landing pads LP, and thus a space of the gap region GP between the first and second sub-spacers 321 and 325 may be stably secured. A dielectric constant of air, gas or vacuum in the gap region GP may be lower than that of silicon oxide, and thus a parasitic capacitance between the bit line BL and the storage node contact BC may be reduced. In addition, a parasitic capacitance between the landing pads LP may be reduced. As a result, reliability of the semiconductor device may be improved.

FIGS. 11A to 11M are cross-sectional views illustrating a method of manufacturing a semiconductor device having cross sections of FIG. 10, according to some embodiments of the inventive concepts.

Figure 11A:
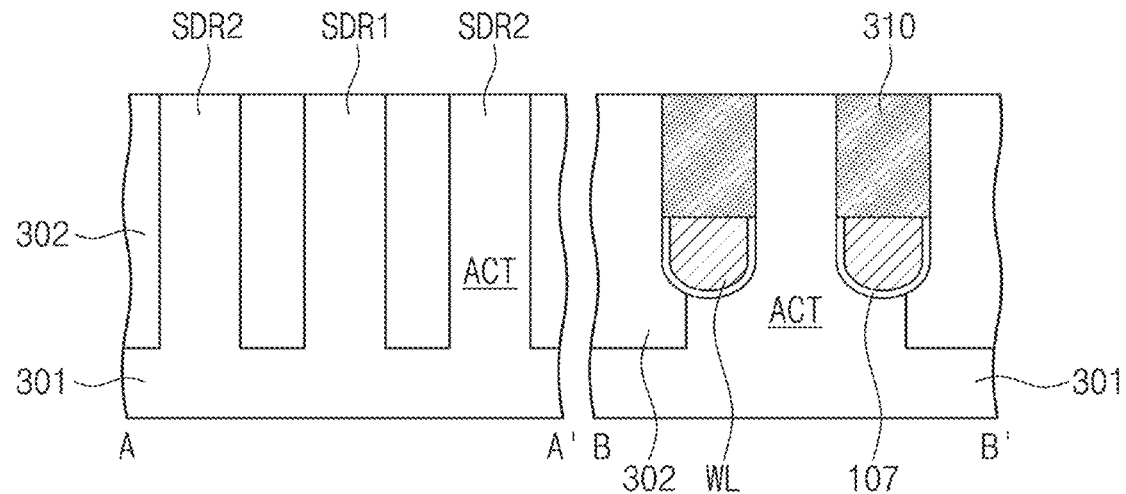
FIGS. 11A to 11M are cross-sectional views illustrating a method of manufacturing a semiconductor device having cross sections of FIG. 10, according to some embodiments of the inventive concepts.

Referring to FIG. 11A, a device isolation pattern 302 may be formed in a substrate 301 to define active portions ACT. A device isolation trench may be formed in the substrate 301, and the device isolation pattern 302 may fill the device isolation trench. The active portions ACT and the device isolation pattern 302 may be patterned to form grooves. At this time, etch recipes of the substrate 301 and the device isolation pattern 302 may be adjusted in such a way that the device isolation pattern 302 is etched more than the substrate 301. Thus, bottom surfaces of the grooves may be uneven.

Word lines WL may be formed in the grooves, respectively. A pair of the word lines WL may intersect each of the active portions ACT. As illustrated in FIG. 9, by the pair of word lines WL, each of the active portions ACT may be divided into a first source/drain region SDR1 and a pair of second source/drain regions SDR2. The first source/drain region SDR1 may be defined between the pair of word lines WL, and the pair of second source/drain regions SDR2 may be defined in both edge regions of each of the active portions ACT.

A gate dielectric layer 107 may be formed on the inner surfaces of the grooves before the formation of the word lines WL. The gate dielectric layer 107 may be formed by a thermal oxidation process, a chemical vapor deposition (CVD) process, and/or an atomic layer deposition (ALD) process. A gate conductive layer may be formed to fill the grooves, and an etch-back process may be performed on the gate conductive layer to form the word lines WL. Top surfaces of the word lines WL may be recessed to be lower than top surfaces of the active portions ACT. An insulating layer (e.g., a silicon nitride layer) may be formed on the substrate 301 to fill the grooves and then may be etched to form word line capping patterns 310 on the word lines WL, respectively.

Figure 11B:
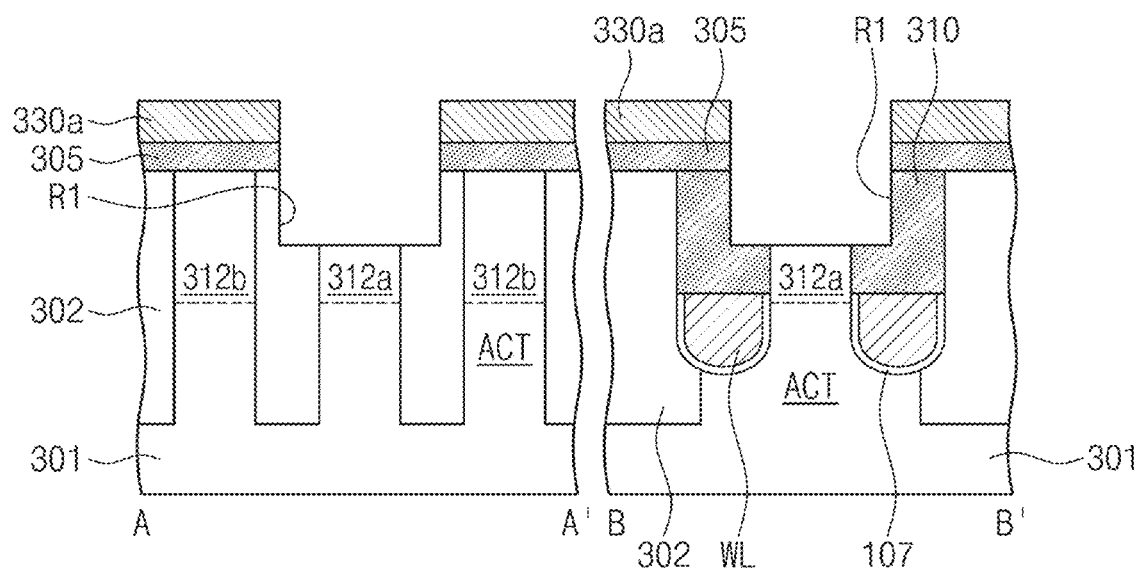

Referring to FIG. 11B, dopants may be injected into the active portions ACT by using the word line capping patterns 310 and the device isolation pattern 320 as masks, thereby forming first and second doped regions 312a and 312b. The first doped region 312a and the second doped regions 312b may be formed in the first source/drain region SDR1 and the second source/drain regions SDR2 of FIG. 11A, respectively. An insulating layer and a first polysilicon layer may be sequentially stacked on an entire surface of the substrate 301. The first polysilicon layer may be patterned to form a polysilicon mask pattern 330a. The insulating layer, the device isolation pattern 302, the substrate 301 and the word line capping patterns 310 may be etched using the polysilicon mask pattern 330a as an etch mask to form a first recess region R1 and an interlayer insulating pattern 305 at the same time. The interlayer insulating pattern 305 may have a plurality of island shapes spaced apart from each other. The interlayer insulating pattern 305 may cover end portions of two active portions ACT adjacent to each other.

The first recess region R1 may have a mesh shape when viewed in a plan view. The first recess region R1 may expose the first doped regions 312a.

Figure 11C:
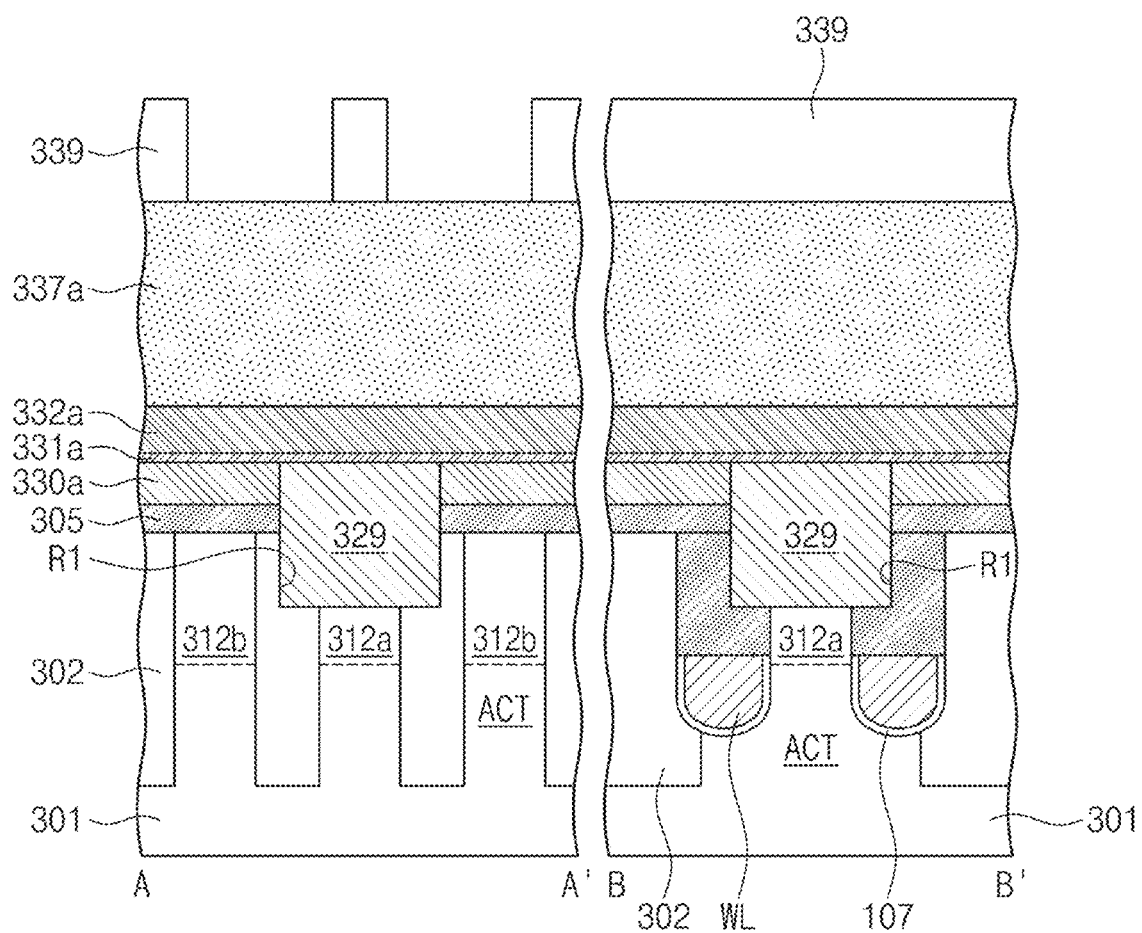

Referring to FIG. 11C, a second polysilicon layer 329 may be formed on an entire surface of the substrate 301 to fill the first recess region R1. A planarization etching process may be performed on the second polysilicon layer 329 to remove the second polysilicon layer 329 on the polysilicon mask pattern 330a and to expose a top surface of the poly-silicon mask pattern 330a. A bit line ohmic layer 331a, a bit line metal-containing layer 332a and a bit line capping layer 337a may be sequentially stacked on the polysilicon mask pattern 330a and the second polysilicon layer 329. The bit line ohmic layer 331a may be formed of a metal silicide such as cobalt silicide. A metal layer may be deposited on the polysilicon mask pattern 330a and the second polysilicon layer 329, and then, a thermal treatment process may be performed to react the metal layer with polysilicon of the polysilicon mask pattern 330a and the second polysilicon layer 329, thereby forming a metal silicide. Thereafter, an unreacted metal layer may be removed to form the bit line ohmic layer 331a.

First mask patterns 339 defining planar shapes of bit lines BL may be formed on the bit line capping layer 337a. The first mask patterns 339 may be formed by the method described with reference to FIGS. 4A to 4H. The first mask patterns 339 may be formed of a material (e.g., an amorphous carbon layer (ACL), a silicon oxide layer, or a photoresist) having an etch selectivity with respect to the bit line capping layer 337a. The first mask patterns 339 may extend in the third direction X3 intersecting the first and second directions X1 and X2.

Figure 11D:
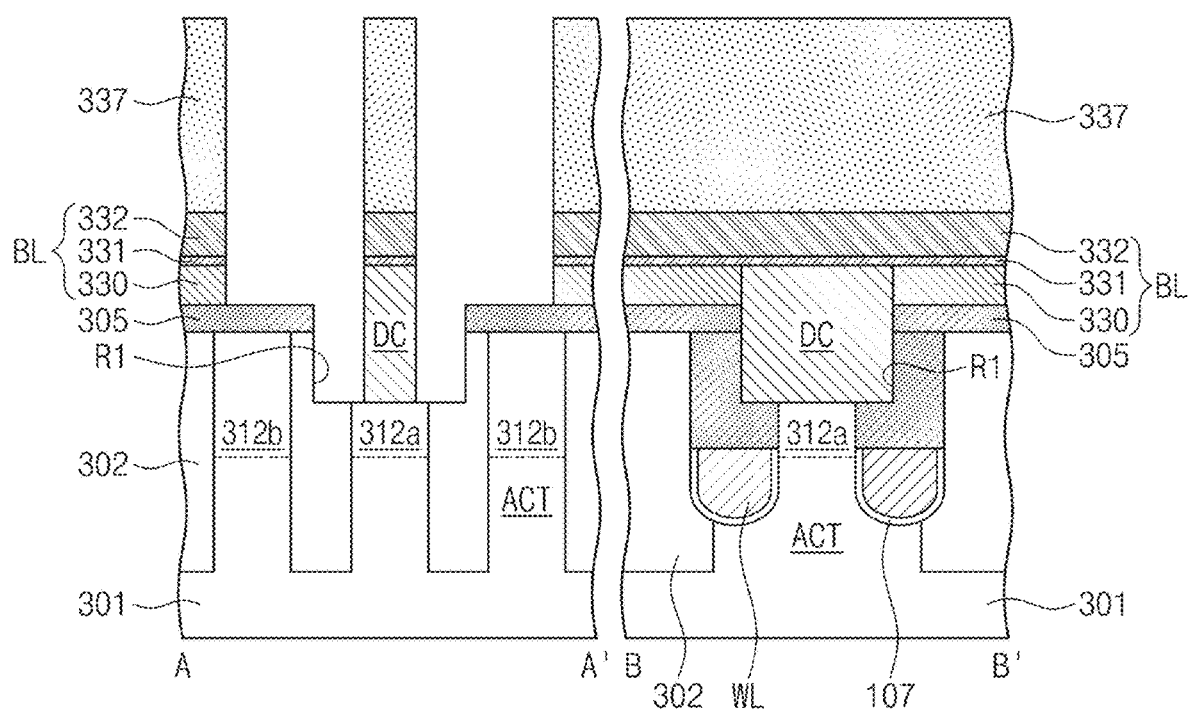

Referring to FIG. 11D, the bit line capping layer 337a, the bit line metal-containing layer 332a, the bit line ohmic layer 331a, the polysilicon mask pattern 330a and the second polysilicon layer 329 may be sequentially etched using the first mask patterns 339 as etch masks to form bit lines BL, bit line contacts DC, and bit line capping patterns 337. Each of the bit lines BL may include a bit line polysilicon pattern 330, a bit line ohmic pattern 331, and a bit line metal-containing pattern 332. In addition, a top surface of the interlayer insulating pattern 305 and an inner sidewall and a bottom surface of the first recess region R1 may be partially exposed. The first mask patterns 339 may be removed.

Figure 11E:
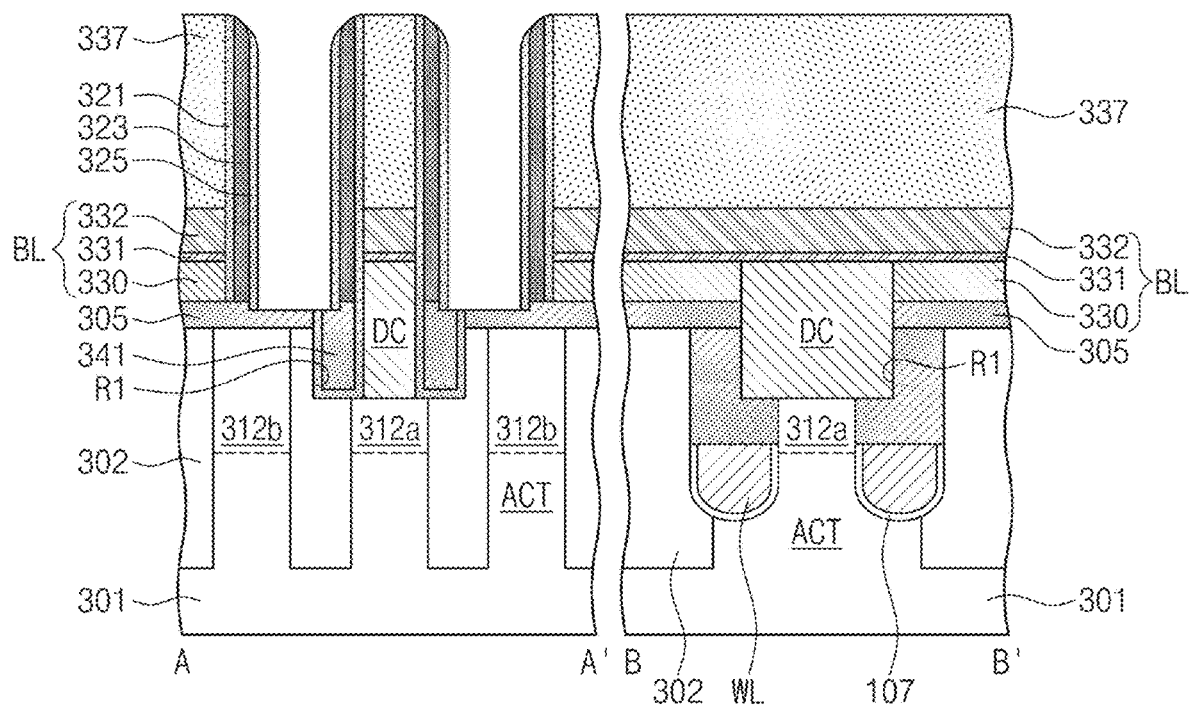

Referring to FIG. 11E, a first sub-spacer layer may be conformally formed on an entire surface of the substrate 301. The first sub-spacer layer may conformally cover the bottom surface and the inner sidewall of the first recess region R1. The first sub-spacer layer may be, for example, a silicon nitride layer. An insulating layer (e.g., a silicon nitride layer) may be formed on an entire surface of the substrate 301 to fill the first recess region R1, and then, an anisotropic etching process may be performed on the insulating layer to form a lower filling insulation pattern 341 in the first recess region R1. At this time, the first sub-spacer layer may also be etched by the anisotropic etching process, and thus a first sub-spacer 321 may be formed. In addition, the top surface of the interlayer insulating pattern 305 may be exposed. A sacrificial spacer layer may be conformally stacked on an entire surface of the substrate 301, and then, an anisotropic etching process may be performed on the sacrificial spacer layer to form a sacrificial spacer 323 covering a sidewall of the first sub-spacer 321. The sacrificial spacer 323 may include a material having an etch selectivity with respect to the first sub-spacer 321. The sacrificial spacer 323 may be formed of, for example, the thermally decomposable layer described with reference to FIG. 2. A second sub-spacer 325 may be formed to cover a sidewall of the sacrificial spacer 323. The second sub-spacer 325 may be formed of, for example, a silicon nitride layer. The top surface of the interlayer insulating pattern 305 may be exposed after the formation of the second sub-spacer 325.

Figure 11F:
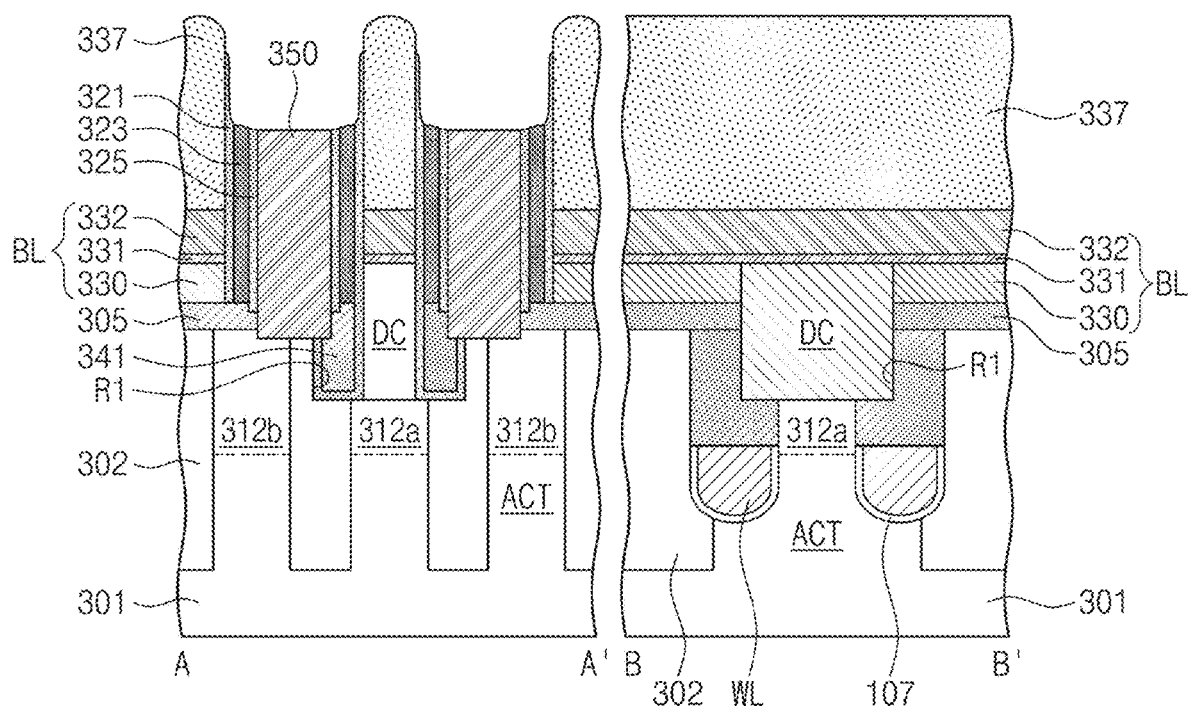

Referring to FIGS. 11E and 11F, a polysilicon layer may be stacked on an entire surface of the substrate 301 to fill a space between the bit lines BL. The polysilicon layer may be etched to form a preliminary storage node contact 350 and to expose upper portions of the first sub-spacer 321, the sacrificial spacer 323 and the second sub-spacer 325. Upper portions of the sacrificial spacer 323 and the second sub-spacer 325 may be removed such that heights of top ends of the sacrificial spacer 323 and the second sub-spacer 325 are similar to a height of a top surface of the preliminary storage node contact 350. Thus, an upper sidewall of the first sub-spacer 321 may be exposed. These processes may increase a process margin of a subsequent process of forming a landing pad. When the upper portions of the sacrificial spacer 323 and the second sub-spacer 325 are removed, an upper portion of the first sub-spacer 321 may also be partially removed, and thus a width of the upper portion of the first sub-spacer 321 may be reduced.

Figure 11G:
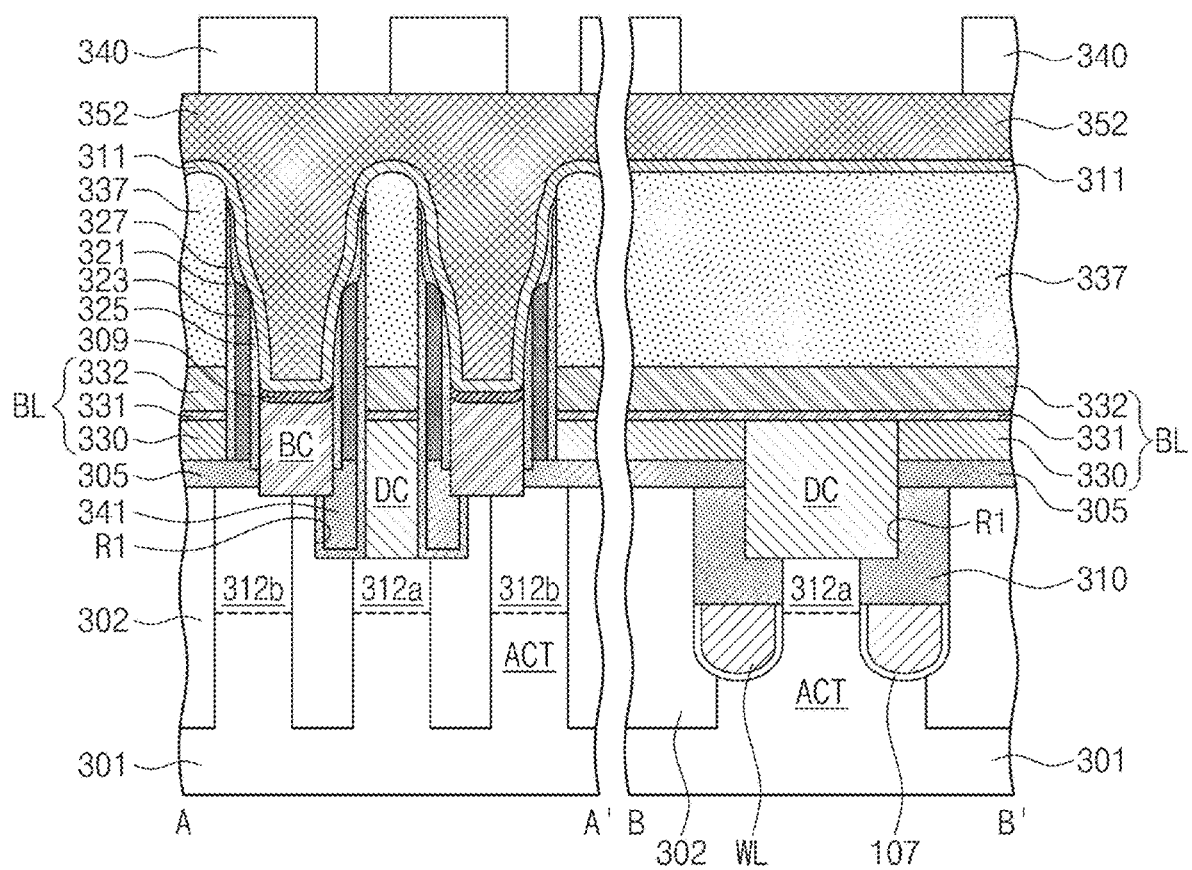

Referring to FIGS. 11F and 11G, a third sub-spacer layer may be conformally formed on an entire surface of the substrate 301, and the third sub-spacer layer may be anisotropically etched to form a third sub-spacer 327 covering the exposed upper sidewall of the first sub-spacer 321. A lower portion of the third sub-spacer 327 may cover the exposed top end of the sacrificial spacer 323. The preliminary storage node contact 350 may be etched to expose an upper sidewall of the second sub-spacer 325 and to form a storage node contact BC. The third sub-spacer 327 may compensate the damaged upper portion of the first sub-spacer 321 and may cover the sacrificial spacer 323 to prevent an etchant of the process of forming the storage node contact BC and a cleaning solution of a subsequent cleaning process from permeating to the bit line BL. Thus, damage of the bit line BL may be prevented. A cleaning process may be performed to clean a top surface of the storage node contact BC. A metal silicide process may be performed on the top surface of the storage node contact BC to form a storage node ohmic layer 309. A diffusion barrier layer 311 may be conformally formed on an entire surface of the substrate 301. Thereafter, a landing pad layer 352 may be formed on an entire surface of the substrate 301 to fill a space between the bit line capping patterns 337. The landing pad layer 352 may include, for example, tungsten. Second mask patterns 340 may be formed on the landing pad layer 352. The second mask patterns 340 may be formed using the method described with reference to FIGS. 1A to 1H or FIG. 3. The second mask patterns 340 may be formed of, for example, an amorphous carbon layer (ACL). The second mask patterns 340 may define positions of landing pads. The second mask patterns 340 may vertically overlap with the storage node contacts BC. The second mask patterns 340 may have island shapes spaced apart from each other.

Figure 11H:
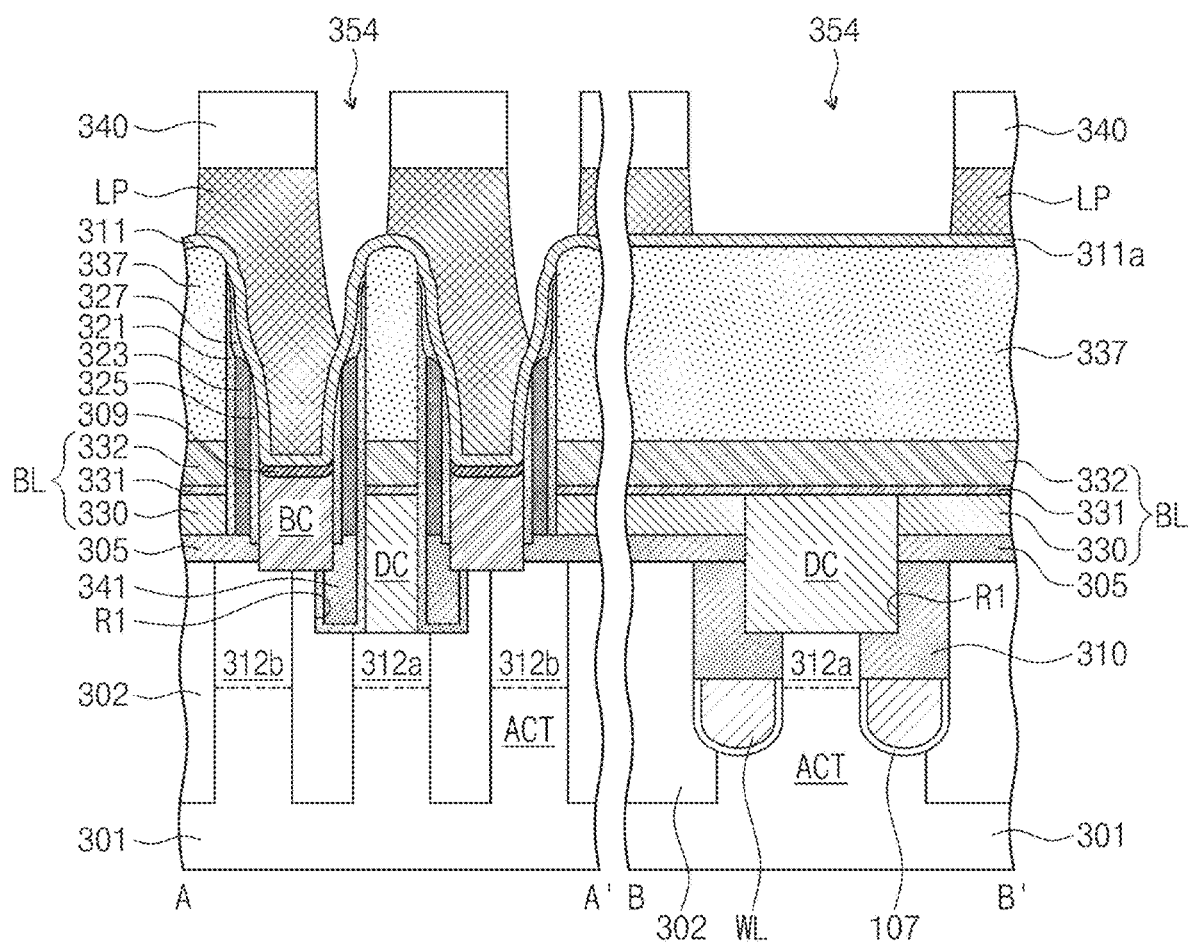

Referring to FIG. 11H, an anisotropic etching process of removing a portion of the landing pad layer 352 may be performed using the second mask patterns 340 as etch masks to form landing pads LP and openings 354 exposing the diffusion barrier layer 311 at the same time.

Figure 11I:
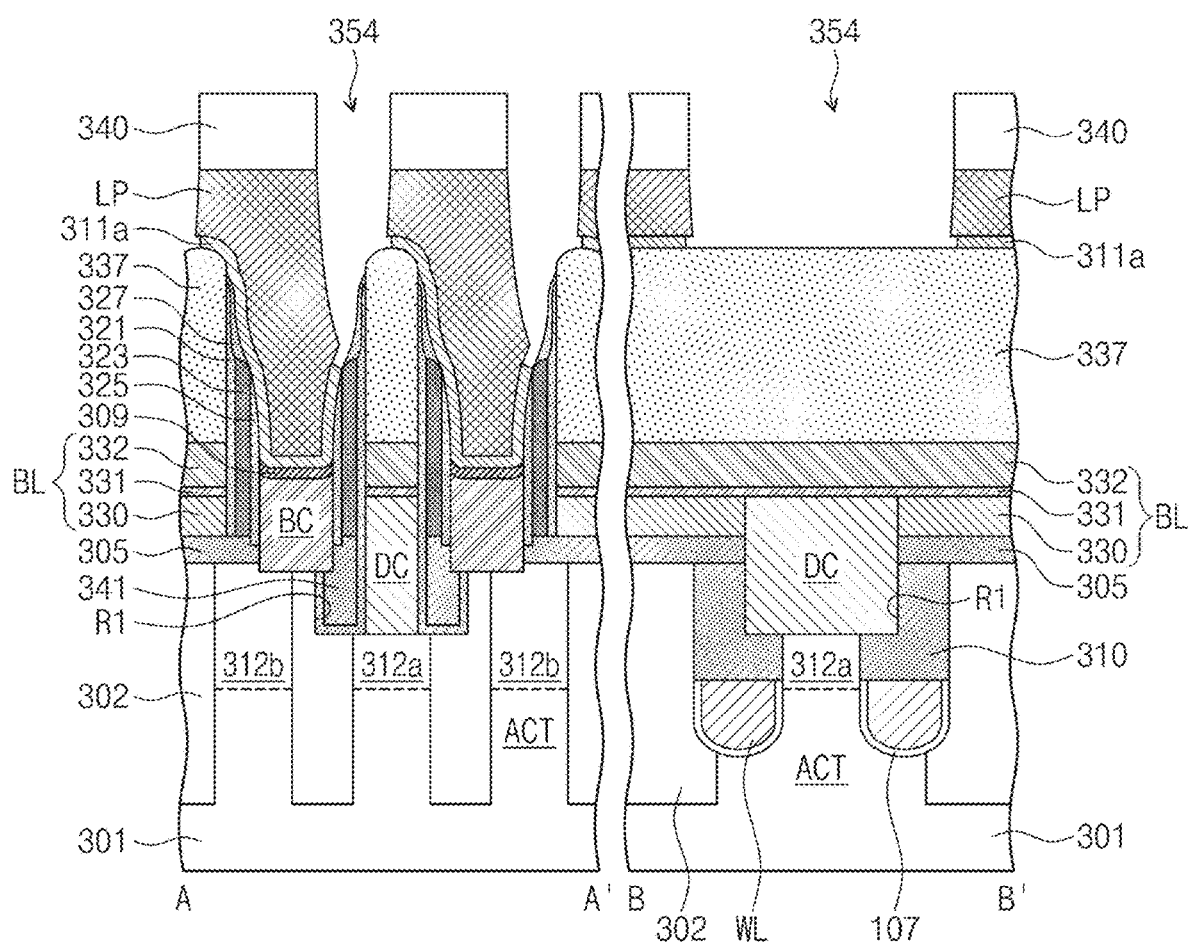

Referring to FIG. 11I, the diffusion barrier layer 311 exposed through the openings 354 may be removed by an isotropic etching process to form diffusion barrier patterns 311a separated from each other and to expose portions of the top surfaces of the bit line capping patterns 337 and the third sub-spacers 327. At this time, the diffusion barrier patterns 311a may be over-etched by the isotropic etching process, and thus bottom surfaces of the landing pads LP may be partially exposed.

Figure 11J:
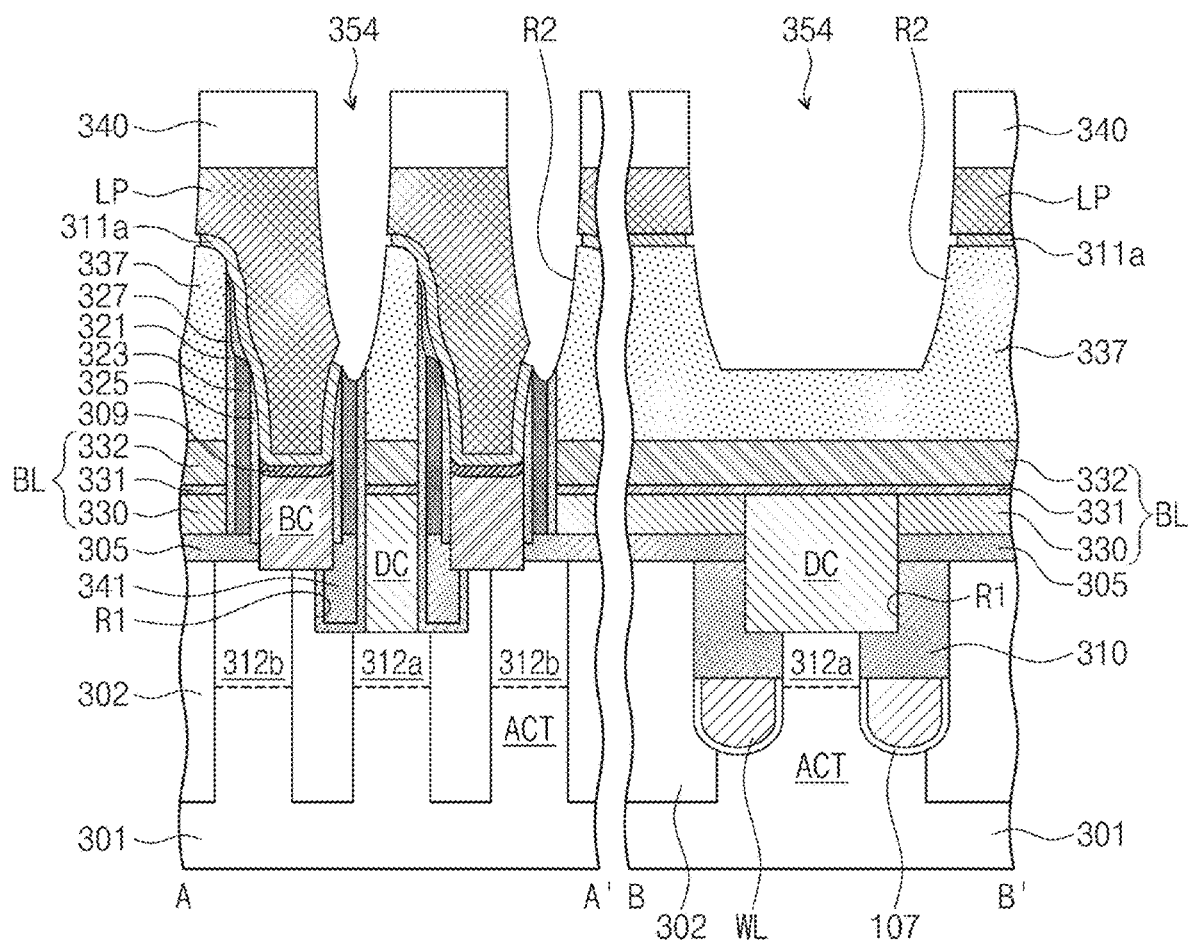

Referring to FIGS. 11I and 11J, an anisotropic etching process may be performed to remove portions of the bit line capping patterns 337 and the third sub-spacers 327, which are exposed through the openings 354, and thus the sacrificial spacer 323 may be exposed. At this time, a second recess region R2 may be formed on the bit line capping pattern 337.

Figure 11K:
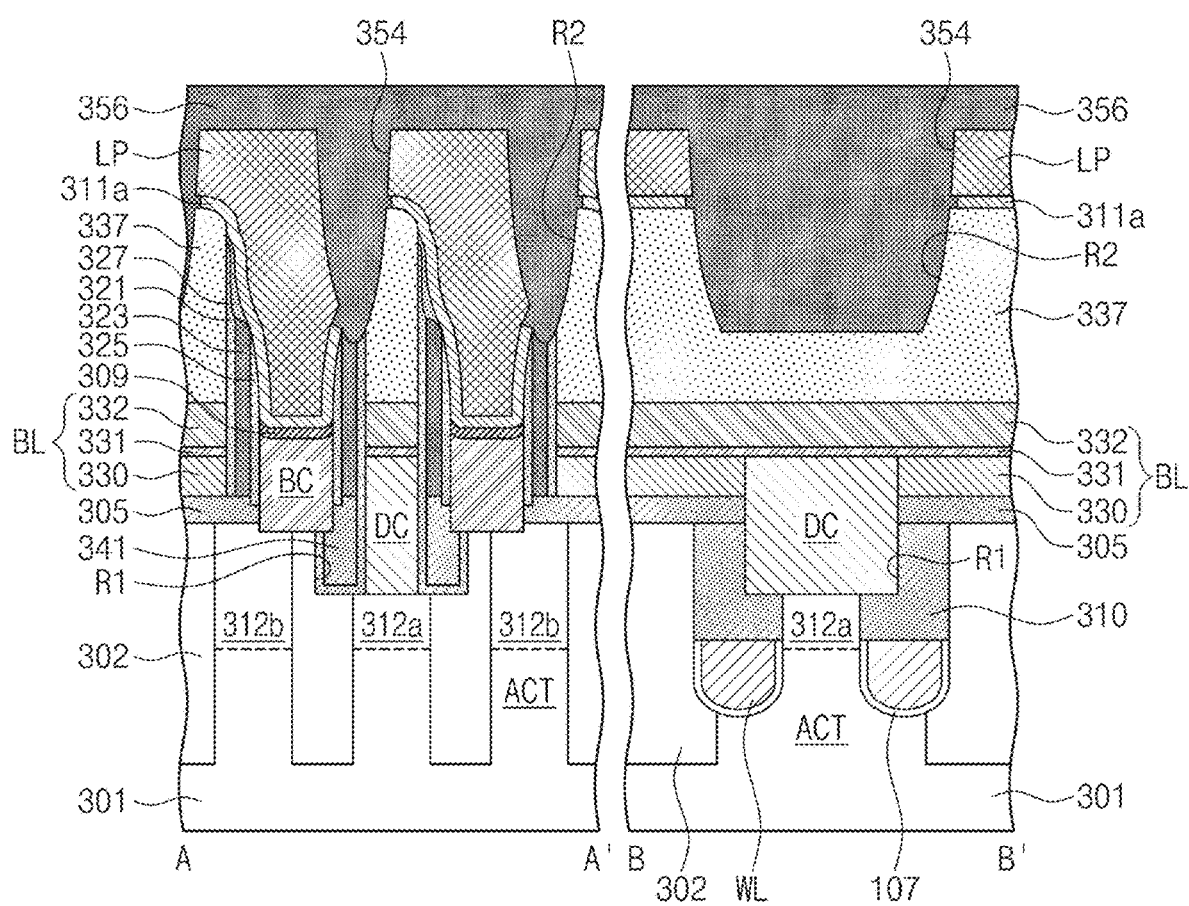

Referring to FIG. 11K, the second mask patterns 340 may be removed. By the method described with reference to FIG. 2, a thermally decomposable layer 356 may be formed to fill the openings 354 and the second recess regions R2. The thermally decomposable layer 356 may also be formed on the landing pads LP. The thermally decomposable layer 356 may be in contact with the sacrificial spacer 323. The thermally decomposable layer 356 may be formed in the thermally decomposable layer deposition chamber 120 of the semiconductor manufacturing apparatus 200 or 201 described with reference to FIGS. 6 to 8.

Figure 11L:
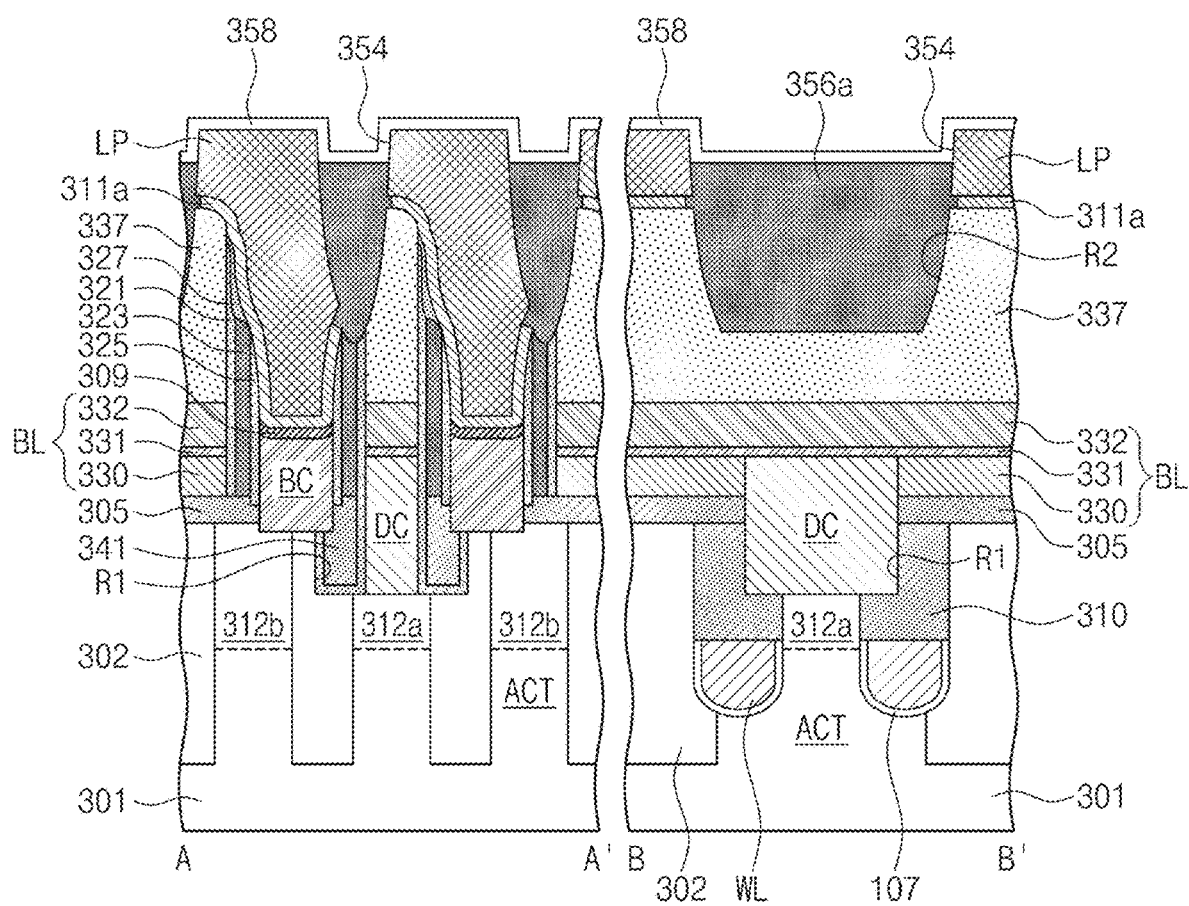

Referring to FIG. 11L, a first annealing process may be performed to remove an upper portion of the thermally decomposable layer 356, and thus the top surfaces and the upper sidewalls of the landing pads LP may be exposed and thermally decomposable patterns 356a spaced apart from each other may be formed. A first capping layer 358 may be conformally formed on the thermally decomposable patterns 356a and the landing pads LP. The first annealing process may be performed in the annealing chamber 130 of FIG. 6 or the first annealing chamber 130a of FIG. 8. The first capping layer 358 may be deposited in the capping layer deposition chamber 140 of FIG. 6 or the first capping layer deposition chamber 140a of FIG. 8.

Figure 11M:
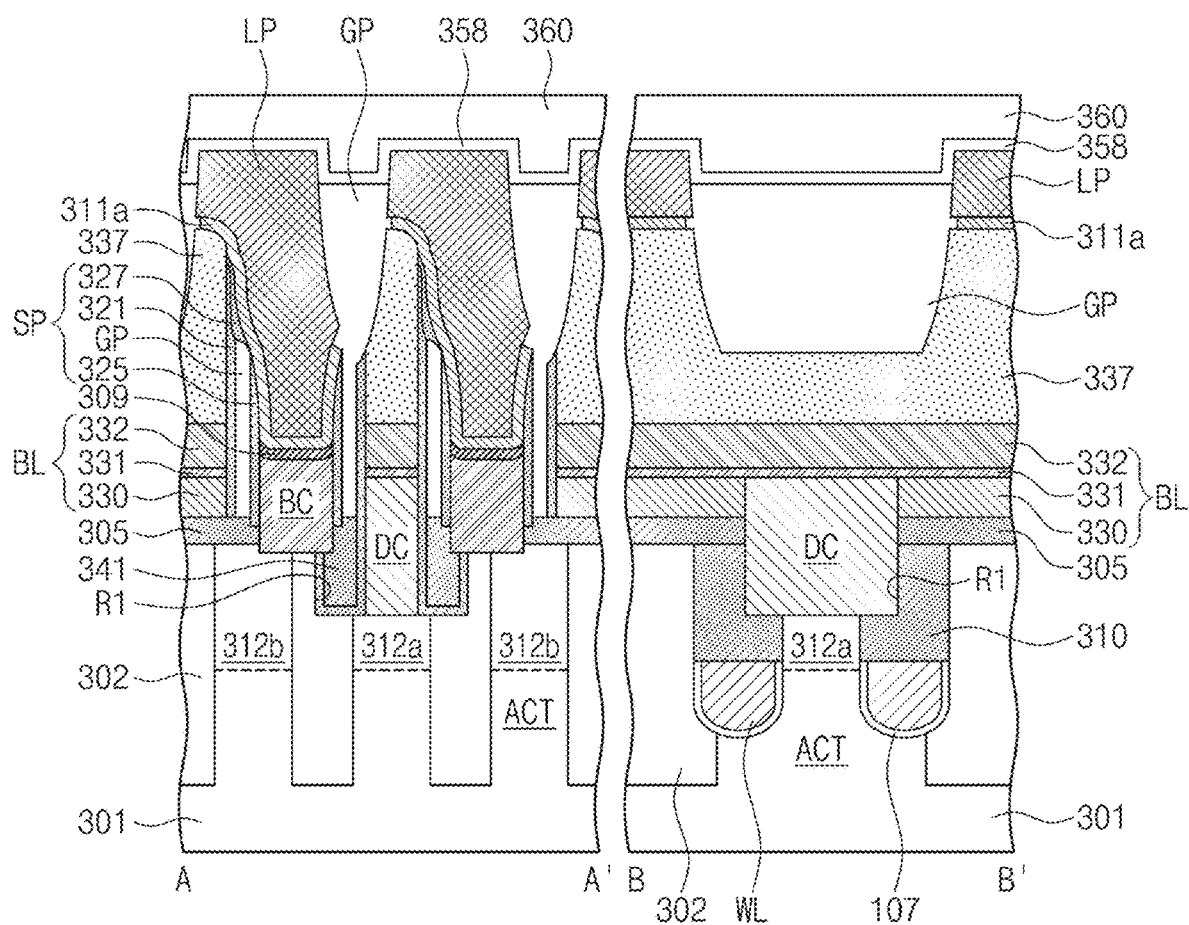

Referring to FIG. 11M, a second annealing process may be performed to remove both the thermally decomposable patterns 356a and the sacrificial spacers 323 and to form gap regions GP. The second annealing process may be performed in the annealing chamber 130 of FIG. 6 or the second annealing chamber 130b of FIG. 8. Next, a second capping layer 360 may be formed on the first capping layer 358. The second capping layer 360 may be deposited in the capping layer deposition chamber 140 of FIG. 6 or the second capping layer deposition chamber 140b of FIG. 8. Subsequently, referring to FIG. 10, an etch-back process or a chemical mechanical polishing (CMP) process may be performed to remove the first and second capping layers 358 and 360 on the landing pads LP, and thus the landing pads LP may be exposed. Next, data storage patterns DS connected to the landing pads LP may be formed.

Figure 12A:
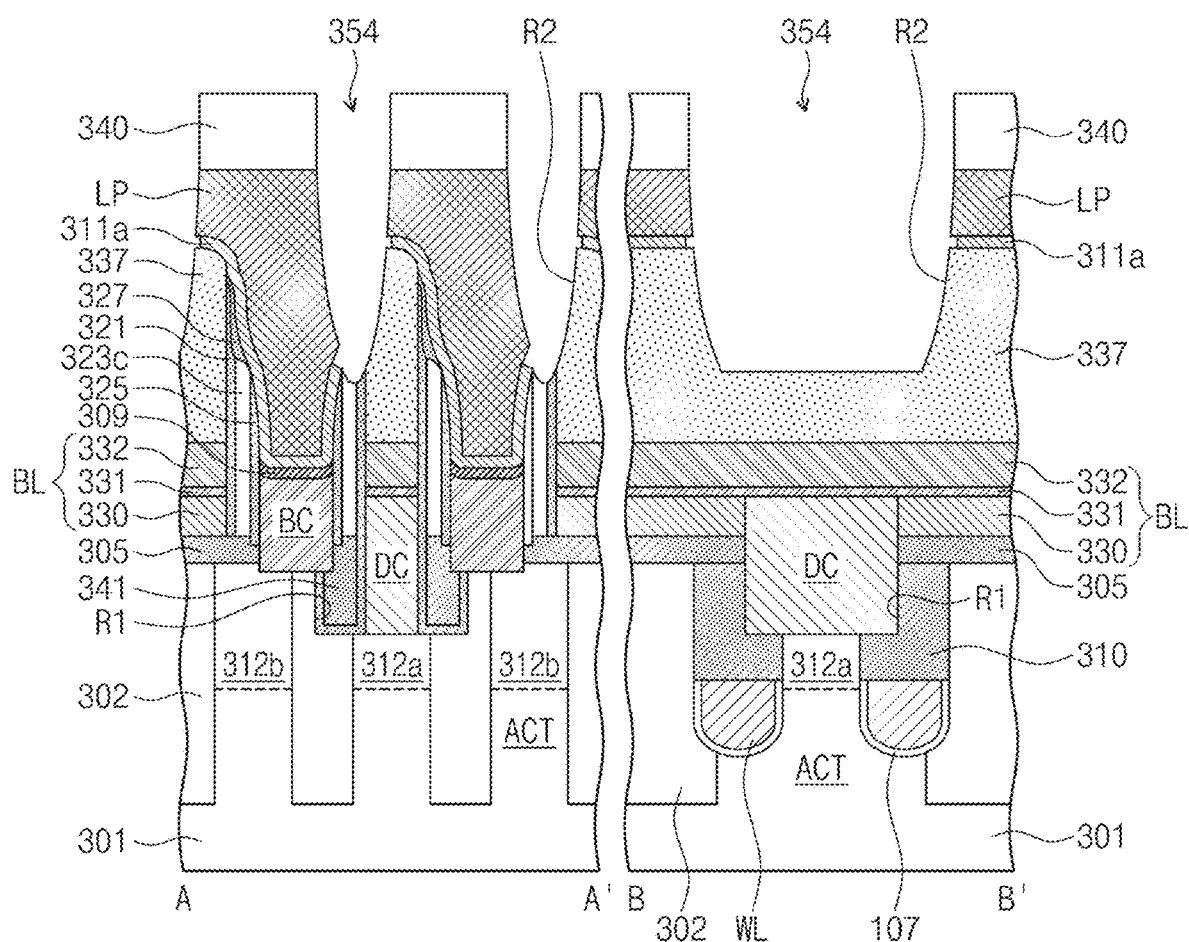
FIGS. 12A to 12C are cross-sectional views illustrating a method of manufacturing a semiconductor device having the cross sections of FIG. 10, according to some embodiments of the inventive concepts.
Figure 12B:
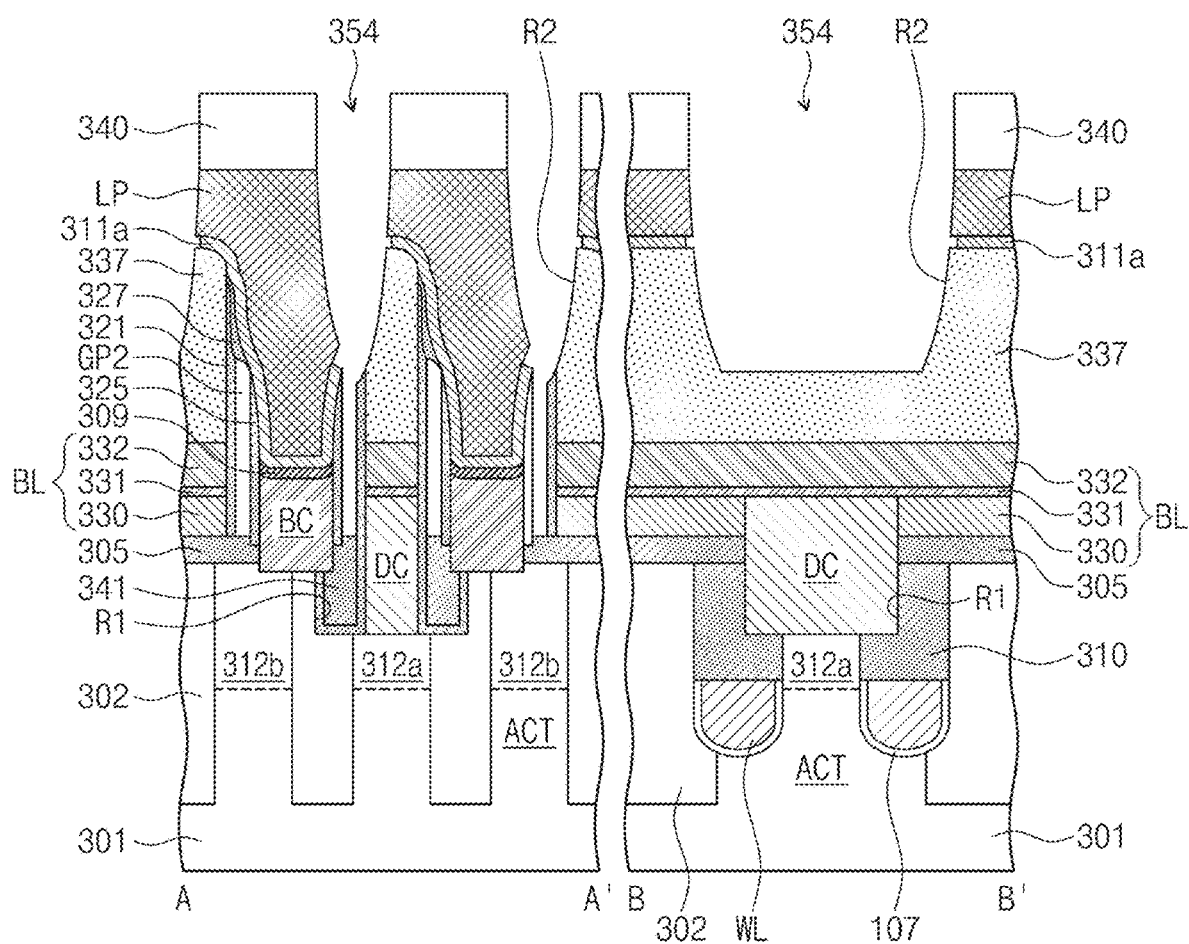
Figure 12C:
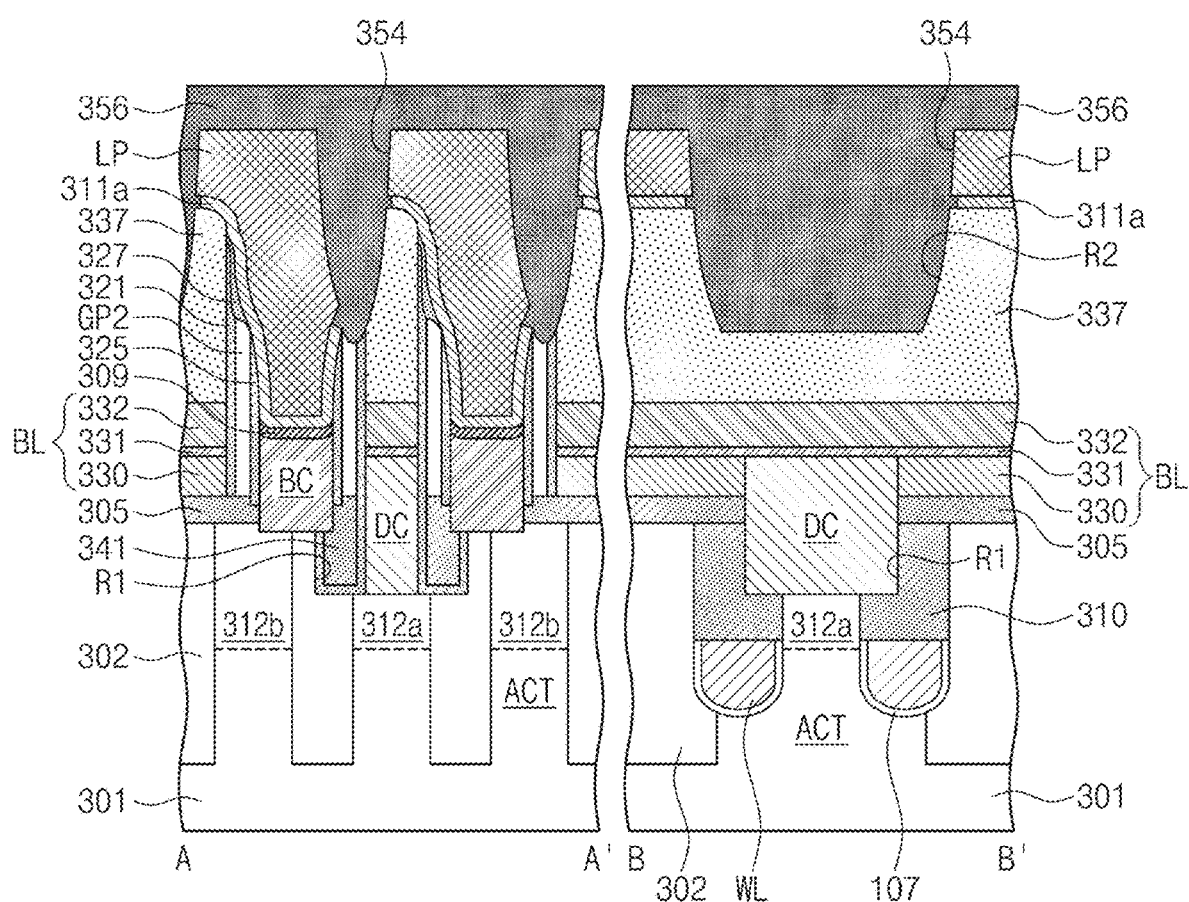

FIGS. 12A to 12C are cross-sectional views illustrating a method of manufacturing a semiconductor device having the cross sections of FIG. 10, according to some embodiments of the inventive concepts.

Referring to FIG. 12A, a sacrificial spacer 323c may be a sacrificial material aside from the thermally decomposable polymer. The sacrificial spacer 323c may be formed of, for example, a silicon oxide layer. As described with reference to FIG. 11J, an anisotropic etching process may be performed to expose a top surface of the sacrificial spacer 323c.

Referring to FIGS. 12B and 12C, the sacrificial spacer 323c exposed by openings 354 may be removed to form a second gap region GP2 between the first sub-spacer 321 and the second sub-spacer 325. Thereafter, a thermally decomposable layer 356 may be formed on the landing pads LP. The thermally decomposable layer 356 may not fill the second gap region GP2 between the first and second subspacers 321 and 325. Subsequently, the processes described with reference to FIGS. 11L and 11M may be performed. In other words, a thermally decomposable pattern 356a may be formed between the landing pads LP. Subsequently, a first capping layer 358 may be formed, and then, the thermally decomposable pattern 356a may be removed to form a gap region GP between the landing pads LP. The gap region GP between the landing pads LP may be connected to the second gap region GP2 between the first and second subspacers 321 and 325.

The method of manufacturing a semiconductor device according to the inventive concepts may use the thermally decomposable layer, and thus the process failure may be reduced. In addition, the semiconductor manufacturing apparatus according to the inventive concepts may reduce the total process time. Furthermore, the semiconductor device according to the inventive concepts may have the improved reliability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
   forming an etch target layer on a substrate;
   forming thermally decomposable patterns spaced apart from each other on the etch target layer;
   forming a first mask pattern covering sidewalls of the thermally decomposable patterns; and
   removing the thermally decomposable patterns by a heating method to expose a sidewall of the first mask pattern; and
   patterning the etch target layer based on the exposed first mask pattern.

2. The method of claim 1, wherein the forming the first mask pattern fills a space between the thermally decomposable patterns and covers top surfaces of the thermally decomposable patterns; and
   the method further comprising, removing an upper portion of the first mask pattern after the removing of the thermally decomposable patterns.

3. The method of claim 2, wherein the forming the first mask pattern comprises:
   coating the thermally decomposable patterns with a spin-on-hardmask (SOH) composite; and
   baking the SOH composite,
   wherein the heating method for removing the thermally decomposable patterns includes the baking of the SOH composite.

4. The method of claim 1, further comprising:
   forming a second mask layer on the etch target layer before the forming the thermally decomposable patterns,
   wherein the removing the thermally decomposable patterns comprises exposing a top surface of the second mask layer.

5. The method of claim 4, further comprising:
   etching the second mask layer using the first mask pattern as a first etch mask to form a second mask pattern; and
   etching the etch target layer using the second mask pattern as a second etch mask.

6. The method of claim 1, wherein the forming the first mask pattern comprises:
   forming a first mask layer conformally covering the thermally decomposable patterns; and
   performing an anisotropic etching process on the first mask layer,
   wherein a width of an upper portion of the first mask pattern is less than a width of a lower portion of the first mask pattern.

7. The method of claim 1, wherein the forming the thermally decomposable patterns comprises:
   forming a thermally decomposable layer by reacting a first monomer and a second monomer on the etch target layer;
   forming second mask patterns on the thermally decomposable layer; and
   etching the thermally decomposable layer using the second mask patterns as etch masks.

8. A method of manufacturing a semiconductor device, the method comprising:
   forming conductive patterns spaced apart from each other on a substrate;
   forming a thermally decomposable layer filling a space between the conductive patterns and covering the conductive patterns;
   forming a thermally decomposable pattern by removing an upper portion of the thermally decomposable layer, the thermally decomposable pattern partially filling the space between the conductive patterns and exposing upper sidewalls of the conductive patterns;
   conformally forming a first capping layer covering the conductive patterns and the thermally decomposable pattern;
   removing the thermally decomposable pattern to form a first gap region exposing lower sidewalls of the conductive patterns; and
   forming a second capping layer on the first capping layer.

9. The method of claim 8, wherein the first capping layer is thinner than the second capping layer.

10. The method of claim 8, further comprising:
    removing the first and second capping layers on the conductive patterns to expose top surfaces of the conductive patterns; and
    forming upper conductive patterns in contact with the conductive patterns.

11. The method of claim 8, before the forming the conductive patterns, further comprising:
    forming word lines extending in a first direction and parallel to each other in the substrate;
    forming first dopant regions and second dopant regions, which are spaced apart from each other, in the substrate between the word lines;
    forming bit lines, which are electrically connected to the first dopant regions and extend in a second direction intersecting the first direction, on the substrate; and
    forming bit line contacts between the bit lines to electrically connect the second dopant regions to the conductive patterns.

12. The method of claim 11, further comprising:
    forming bit line capping patterns on the bit lines, before the forming the bit line contacts;
    forming a diffusion barrier layer covering the bit line capping patterns and top surfaces of the bit line contacts, after the forming the bit line contacts and before the forming the conductive patterns; and removing the diffusion barrier layer not overlapping with the conductive patterns after the forming the conductive patterns and before the forming the thermally decomposable pattern, wherein the removing of the diffusion barrier layer comprises exposing portions of bottom surfaces the conductive patterns on the bit line capping patterns.

13. The method of claim 11, further comprising:

forming bit line spacers covering sidewalls of the bit lines and including a sacrificial spacer before the forming the conductive patterns; and exposing an upper portion of the sacrificial spacer after the forming the conductive patterns and before the forming the thermally decomposable pattern.

14. The method of claim 13, further comprising:

removing the sacrificial spacer to form a second gap region before the forming the thermally decomposable pattern, wherein a top end of the second gap region is closed in the forming the thermally decomposable pattern, and wherein the first gap region and the second gap region are connected to each other in the removing the thermally decomposable pattern to form the first gap region.

15. The method of claim 13, wherein the sacrificial spacer includes a thermally decomposable material, the thermally decomposable pattern is in contact with the sacrificial spacer in the forming the thermally decomposable pattern, and the sacrificial spacer is simultaneously removed when the thermally decomposable pattern is removed.

16. The method of claim 8, wherein the forming of the thermally decomposable layer comprises:

reacting a first monomer and a second monomer with each other to form a polymer, wherein the removing the upper portion of the thermally decomposable layer is performed by a first annealing process, and wherein the removing the thermally decomposable pattern is performed by a second annealing process.

17. The method of claim 8, wherein the removing the thermally decomposable pattern is performed at a first temperature; and the forming of the first capping layer is performed at a second temperature, the second temperature is lower than the first temperature.

18. The method of claim 8, wherein the removing the thermally decomposable pattern is performed at a first temperature; and the forming of the thermally decomposable layer is performed at a second temperature, the second temperature is lower than the first temperature.

19. The method of claim 8, wherein the removing the thermally decomposable pattern is performed at a first temperature; and the removing of the thermally decomposable pattern is performed at a second temperature, the second temperature is higher than the first temperature.

20. The method of claim 8, wherein a porosity of the first capping layer is greater than a porosity of the second capping layer.

* * * * *